(12) United States Patent
Oh

(10) Patent No.: US 8,333,839 B2
(45) Date of Patent: Dec. 18, 2012

(54) VAPOR DEPOSITION REACTOR

(75) Inventor: Jae-eung Oh, New York, NY (US)

(73) Assignee: Synos Technology, Inc., Fremont, CA (US)

( * ) Notice: Subject to any disclaimer, the term of this patent is extended or adjusted under 35 U.S.C. 154(b) by 1080 days.

(21) Appl. No.: 11/965,235

(22) Filed: Dec. 27, 2007

(65) Prior Publication Data
US 2009/0165715 A1 Jul. 2, 2009

(51) Int. Cl.
C23C 16/00 (2006.01)
C23C 16/455 (2006.01)
C23C 16/46 (2006.01)
C23C 16/511 (2006.01)
C23C 16/54 (2006.01)

(52) U.S. Cl. ............... 118/715; 118/718; 118/723 R; 118/723 MW; 118/724; 118/725

(58) Field of Classification Search .............. 118/715, 118/718, 723 R, 724, 725
See application file for complete search history.

(56) References Cited

U.S. PATENT DOCUMENTS

| | | | | |
|---|---|---|---|---|
| 4,293,326 A * | 10/1981 | Terneu et al. | .................. | 65/60.2 |
| 4,834,020 A * | 5/1989 | Bartholomew et al. | ....... | 118/719 |
| 4,891,247 A * | 1/1990 | Shamshoian | ................. | 438/694 |
| 5,122,391 A * | 6/1992 | Mayer | ........................ | 427/126.3 |
| 5,136,975 A * | 8/1992 | Bartholomew et al. | ....... | 118/715 |
| 5,683,516 A * | 11/1997 | DeDontney et al. | .......... | 118/718 |
| 5,935,647 A * | 8/1999 | DeDontney et al. | ....... | 427/248.1 |
| 6,022,414 A * | 2/2000 | Miller et al. | .................. | 118/718 |
| 6,083,355 A | 7/2000 | Spence | | |
| 6,195,504 B1 | 2/2001 | Horie et al. | | |
| 6,200,389 B1 * | 3/2001 | Miller et al. | .................. | 118/729 |
| 6,435,428 B2 | 8/2002 | Kim et al. | | |
| 6,521,048 B2 * | 2/2003 | Miller et al. | .................. | 118/729 |
| 6,539,891 B1 | 4/2003 | Lee et al. | | |
| 6,634,314 B2 | 10/2003 | Hwang et al. | | |
| 6,656,284 B1 | 12/2003 | Hwang et al. | | |
| 6,812,157 B1 * | 11/2004 | Gadgil | ......................... | 438/763 |

(Continued)

FOREIGN PATENT DOCUMENTS

JP 2003-324070 11/2003
(Continued)

OTHER PUBLICATIONS

PCT International Search Report, PCT Application No. PCT/US12/24451, May 21, 2012, 12 pages.

(Continued)

*Primary Examiner* — Jeffrie R Lund
(74) *Attorney, Agent, or Firm* — Fenwick & West LLP

(57) ABSTRACT

A vapor deposition reactor has a configuration where a substrate or a vapor deposition reactor moves in a non-contact state with each other to allow the substrate to pass by the reactor and an injection unit and an exhaust unit are installed as a basic module of the reactor for receiving a precursor or a reactant and for receiving and pumping a purge gas, respectively. With the use of a small-size inlet for the reactor, homogeneous film properties are obtained, the deposition efficiency of precursors is improved, and an amount of time required for a purge/pumping process can be reduced. In addition, since the reactor itself is configured to reflect each step of ALD, it does not need a valve. Moreover, the reactor makes it easier for users to apply remote plasma, use super high frequencies including microwave, and UV irradiation.

20 Claims, 26 Drawing Sheets

U.S. PATENT DOCUMENTS

| | | | |
|---|---|---|---|
| 6,890,386 B2 * | 5/2005 | DeDontney et al. | 118/715 |
| 7,087,119 B2 * | 8/2006 | Sandhu | 118/715 |
| 7,384,680 B2 | 6/2008 | Bi et al. | |
| 7,455,884 B2 * | 11/2008 | Sandhu | 427/255.23 |
| 7,615,486 B2 * | 11/2009 | Yoon et al. | 438/640 |
| 2003/0072881 A1 | 4/2003 | Yang et al. | |
| 2003/0198587 A1 | 10/2003 | Kaloyeros et al. | |
| 2004/0265195 A1 | 12/2004 | Lee | |
| 2006/0183301 A1 | 8/2006 | Yeom et al. | |
| 2008/0260940 A1 * | 10/2008 | Yoon et al. | 427/96.2 |
| 2008/0260967 A1 * | 10/2008 | Yoon et al. | 427/576 |
| 2009/0047775 A1 | 2/2009 | Yamazaki et al. | |
| 2009/0064932 A1 | 3/2009 | Kim et al. | |
| 2009/0068849 A1 * | 3/2009 | Endo et al. | 438/763 |
| 2009/0098276 A1 | 4/2009 | Burrows et al. | |
| 2009/0165715 A1 * | 7/2009 | Oh | 118/723 R |
| 2009/0320749 A1 * | 12/2009 | Yoon et al. | 118/58 |
| 2010/0037820 A1 | 2/2010 | Lee | |
| 2010/0041213 A1 | 2/2010 | Lee | |
| 2010/0132615 A1 | 6/2010 | Kato et al. | |
| 2010/0140802 A1 * | 6/2010 | Matsumoto et al. | 257/741 |
| 2010/0221426 A1 * | 9/2010 | Sferlazzo | 427/255.26 |
| 2010/0310771 A1 | 12/2010 | Lee | |
| 2011/0076421 A1 | 3/2011 | Lee | |
| 2012/0196050 A1 * | 8/2012 | Vermeer et al. | 427/535 |
| 2012/0207926 A1 | 8/2012 | Lee | |
| 2012/0225204 A1 * | 9/2012 | Yudovsky | 427/248.1 |
| 2012/0225206 A1 * | 9/2012 | Yudovsky | 427/255.5 |
| 2012/0225207 A1 * | 9/2012 | Yudovsky | 427/255.5 |

FOREIGN PATENT DOCUMENTS

| | | |
|---|---|---|
| JP | 2005-116898 | 4/2005 |
| KR | 10-2001-0040561 | 5/2001 |
| KR | 10-2002-0078804 | 10/2002 |
| KR | 10-2002-0083564 | 11/2002 |
| KR | 1020030086056 A | 11/2003 |
| KR | 10-2004-0016779 | 2/2004 |
| KR | 10-2005-0015931 | 2/2005 |
| KR | 10-0542736 | 1/2006 |
| KR | 10-0631972 A | 8/2006 |
| KR | 10-0622609 B1 | 9/2006 |
| KR | 10-2006-104230 | 10/2006 |
| KR | 10-2006-0117607 | 11/2006 |
| KR | 10-0760428 A | 11/2006 |
| KR | 10-0673211 B1 | 1/2007 |
| KR | 10-2007-0076955 | 7/2007 |
| KR | 10-2007-0096770 | 10/2007 |
| KR | 10-2007-0101127 | 10/2007 |
| KR | 10-2007-0101360 | 10/2007 |
| KR | 10-0791677 B1 | 1/2008 |
| KR | 10-0840897 B1 | 6/2008 |
| KR | 10-2008-0067042 | 7/2008 |
| WO | WO 99/39144 A1 | 8/1999 |
| WO | WO 2007/106076 A2 | 9/2007 |

OTHER PUBLICATIONS

PCT Written Opinion, PCT Application No. PCT/KR2010/001076, Sep. 27, 2010, 8 pages.

PCT International Search Report and Written Opinion, PCT Application No. PCT/US2010/037660, Aug. 3, 2010, 9 pages.

PCT International Search Report and Written Opinion, PCT/US2010/050358, Dec. 1, 2010, 10 pages.

PCT International Search Report and Written Opinion, PCT Application No. PCT/US11/45199, Dec. 6, 2011, 10 pages.

U.S. Appl. No. 13/190,104, filed Jul. 25, 2011, Inventor: Sang In Lee.

* cited by examiner

512

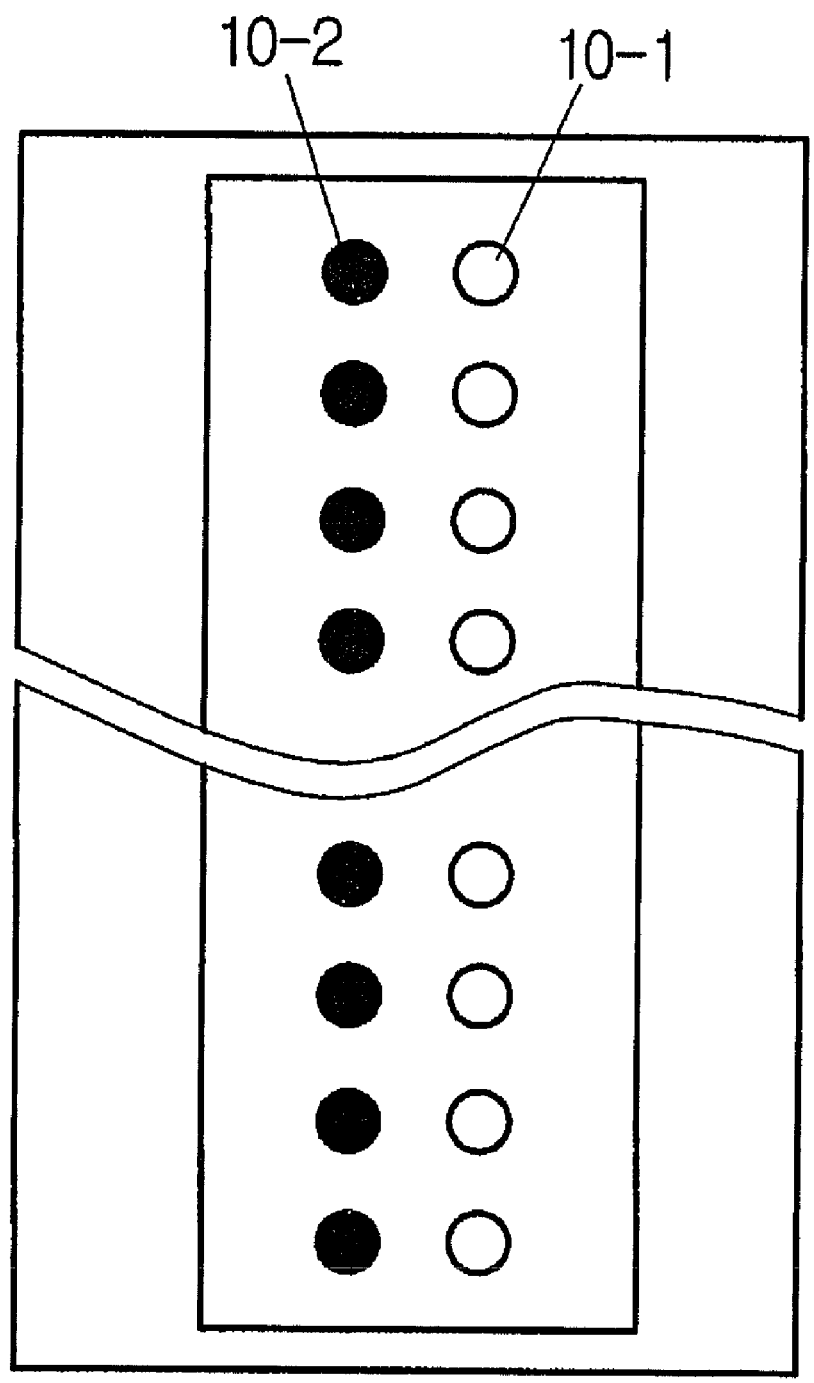

VAPOR DEPOSITION REACTOR

BACKGROUND OF THE INVENTION

1. Field of the Invention

The present invention relates to a reactor used for a vapor deposition scheme.

Recently, a technique of atomic layer deposition (hereinafter referred to as 'ALD') has been widely used as a vapor deposition method. For better understanding of the principle(s) of the present invention the following will explain about an ALD reactor as an exemplary prior art, but it should be noted that the present invention is not limited thereto.

2. Description of the Related Art

ALD injects, as shown in FIG. 1, one or more precursors into a reactor and carries out a purge/pump of the precursor to maintain or leave one or more molecule layers on a substrate. Then it injects one or more reactants into the reactor and carries out a purge/pump to obtain one or more mono-atomic reacted layers. Therefore, one or more mono-atomic layers are formed through one cycle consisting of four steps.

A conventional ALD reactor adopts a cross-flow scheme (this is also called as a 'traveling-wave' scheme) where a precursor, a reactant, a purge gas and the like are injected parallely to the surface of a target substrate for deposition, or a shower-head scheme where a precursor, a reactant, a purge gas and the like are injected perpendicularly to the surface of a target substrate for deposition. FIG. 2 illustrates a cross-flow ALD reactor, and FIG. 3 illustrates a shower-head ALD reactor.

In the cross-flow scheme precursors are injected parallely to the surface of a substrate as depicted in FIG. 2, so all the precursors do not necessarily reach the substrate at the same time, but a substrate near an injection port experiences an adsorption phenomenon first, followed by a substrate on the side of an exhaust port later on. Thus, adsorption can be expressed as a function of time. In particular, when large area substrates are used this phenomenon becomes more evident and it may even cause a serious problem, for example, compositions may vary or film properties may be changed according to the locations of an injection port and an exhaust port.

In the shower-head scheme, however, an injection port (sub-injection ports to be more specific) is spaced apart from a substrate by a uniform distance as depicted in FIG. 3, so precursors adsorb at the surface of the substrate almost at the same time. In this manner, the shower-head scheme, compared with the cross-flow scheme, can be advantageously used for obtaining a thin film having homogenous properties. Meanwhile, a reactor using such a shower-head injection port has a large volume so that it takes long to carry out a purge/pumping process and uses a large amount of precursors and reactants.

These two types of conventional ALD reactors periodically receive a precursor, a reactant, and a purge gas therein via a valve. Such a valve operates at high speed and at high frequencies. For instance, in order to deposit a 1 µm-atomic layer, the valve needs to operate 10,000 times or more for each process. This actually causes problems related to the lifespan of a valve. Moreover, both ALD reactors of the prior art are designed to be rather difficult for the application of remote plasma, the use of high frequencies including microwave, UV irradiation and so on.

BRIEF SUMMARY OF THE INVENTION

It is, therefore, an object of the present invention to provide a vapor deposition reactor that exhibits homogeneous film properties yet has an improved deposition efficiency of precursors and a substantially reduced time required for a purge/pumping process.

It is also another object of the present invention to provide a vapor deposition reactor which does not require a fast-switching high speed ALD valve.

It is yet another object of the present invention to provide a vapor deposition reactor designed to make it easier for users to apply remote plasma, use super high frequencies including microwave and irradiate ultraviolet rays.

In accordance with an embodiment of the present invention, there is provided a vapor deposition reactor having a configuration where a substrate or a vapor deposition reactor moves in a non-contact state with each other to allow the substrate to pass by the reactor, and an injection unit and an exhaust unit are installed as a basic module of the reactor for receiving a precursor or a reactant and for receiving and pumping a purge gas, respectively.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

FIGS. 10A, 10B and FIGS. 11A, 11B respectively illustrate an injection unit consisting of two injection ports.

DETAILED DESCRIPTION OF THE INVENTION

Hereinafter, preferred embodiments of the present invention will be set forth in detail with reference to the accompanying drawings so that those skilled in the art can easily carry out the invention.

A vapor deposition reactor according to an embodiment of the invention has a configuration where a substrate or a vapor deposition reactor moves in non-contact state with each other to allow the substrate to pass by the reactor. A portion of the reactor being open to the substrate is a place where a precursor, a purge gas, or a reactant outflows from the reactor. The following will describe a reactor with the configuration aforementioned, by relating to a exemplary situation where a precursor, a purge gas, or a reactant outflows downward from the reactor, and the substrate travels along a lower part of the reactor.

Figure 1:
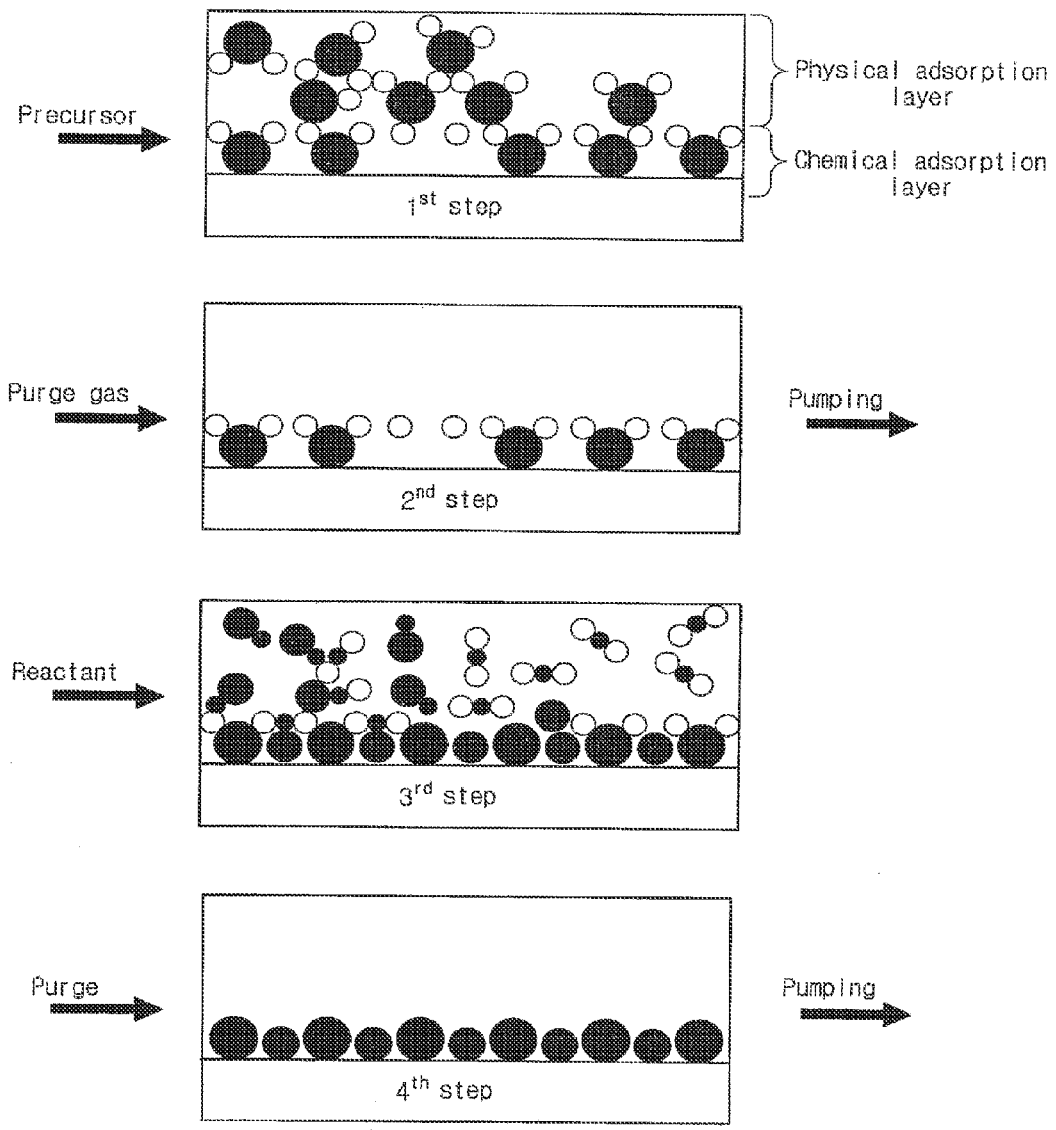
FIG. 1 illustrates 4 successive steps of atomic layer deposition (ALD).
Figure 2:
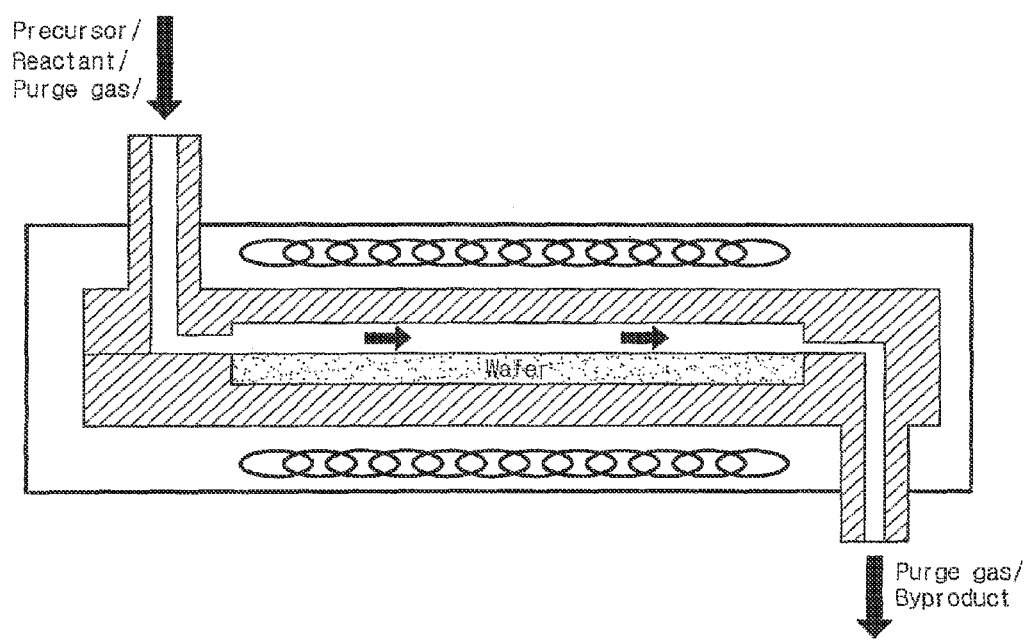
FIG. 2 illustrates a conventional cross-flow ALD reactor.
Figure 3:
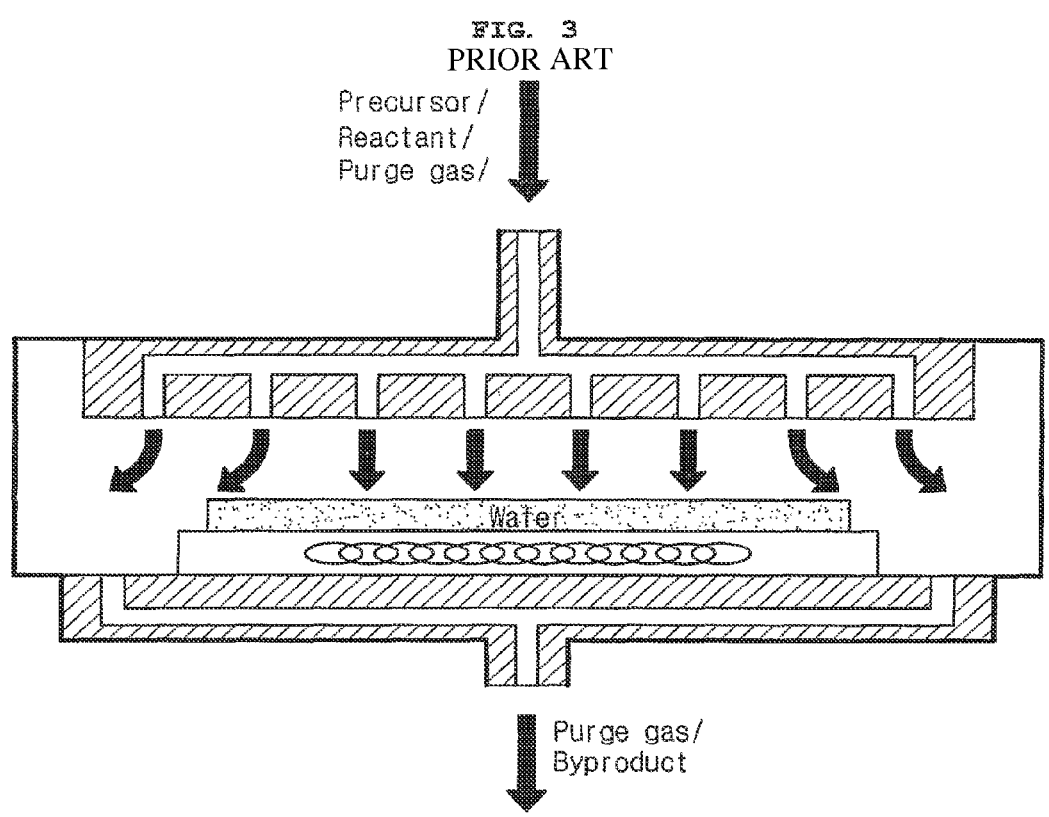
FIG. 3 illustrates a conventional shower-head ALD reactor.
Figure 4:
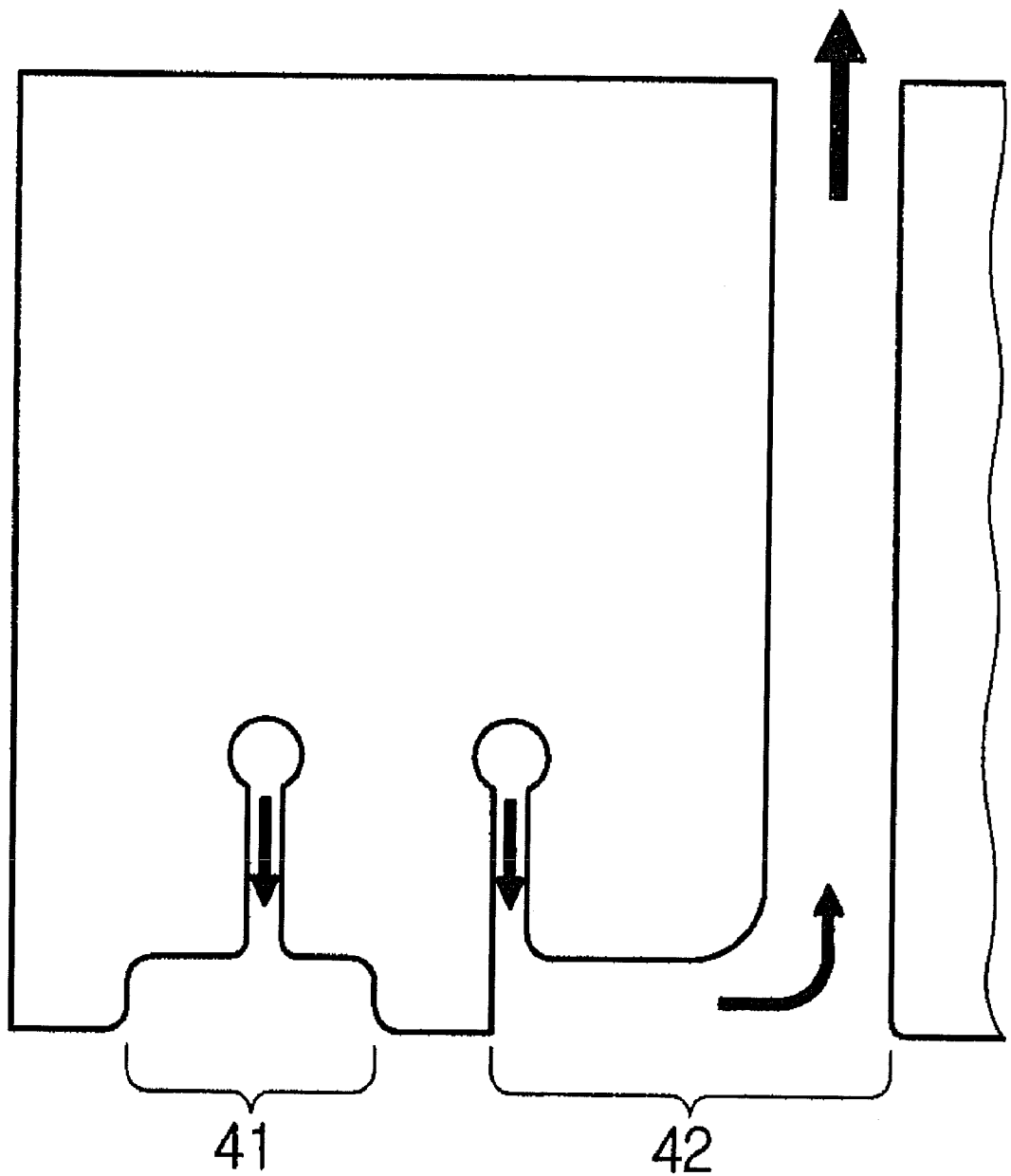
FIG. 4 illustrates a basic module of a reactor according to an embodiment of the present invention.

As shown in FIG. 4, a basic module of a vapor deposition reactor according to an embodiment of the invention is provided with an injection unit 41 and an exhaust unit 42. In this configuration, either the vapor deposition reactor or a substrate below moves in order to make a portion of the substrate having passed by the injection unit 41 pass by the exhaust unit 42 next. At this time, the vapor deposition reactor or the substrate may move linearly or rotatably. The following description will be directed to the linear movement of a substrate for convenience of explanation.

Figure 5:
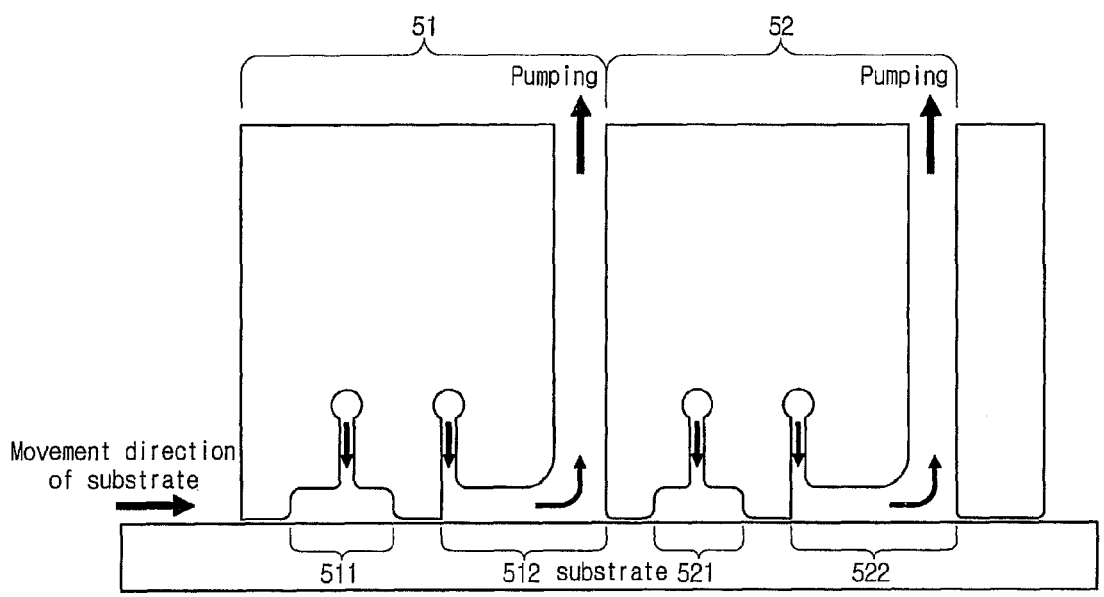
FIG. 5 illustrates an ALD reactor provided with two basic modules shown in FIG. 4.

FIG. 5 illustrates an ALD reactor using two of the present invention basic modules shown in FIG. 4.

A precursor is injected into an injection unit 511 of a first module 51, and a purge gas is injected into an exhaust unit 512 of the first module 51 and then purged/pumped. Similarly, a reactant is injected into an injection unit 521 of a second module 52, and a purge gas is injected into an exhaust unit 522 of the second module 52 and then purged/pumped. Meanwhile, a substrate successively passes by the injection unit 511 of the first module 51→the exhaust unit 512 of the first module 51→the injection unit 521 of the second module 52→the exhaust unit 522 of the second module 52, operating on a 4 step cycle to form an atomic layer on the substrate.

Figure 6:
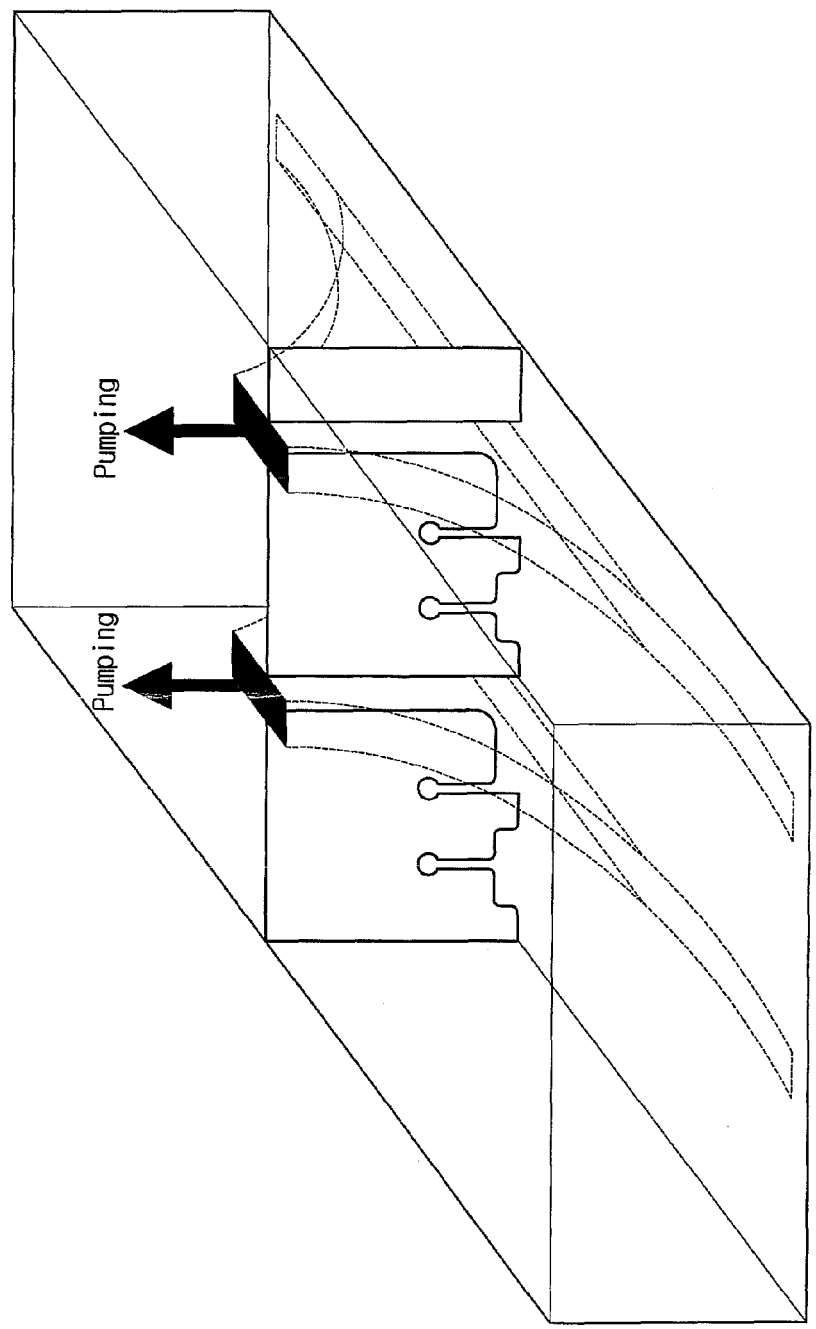
FIG. 6 illustrates a schematic overall view of the ALD reactor shown in FIG. 5.
Figure 7:
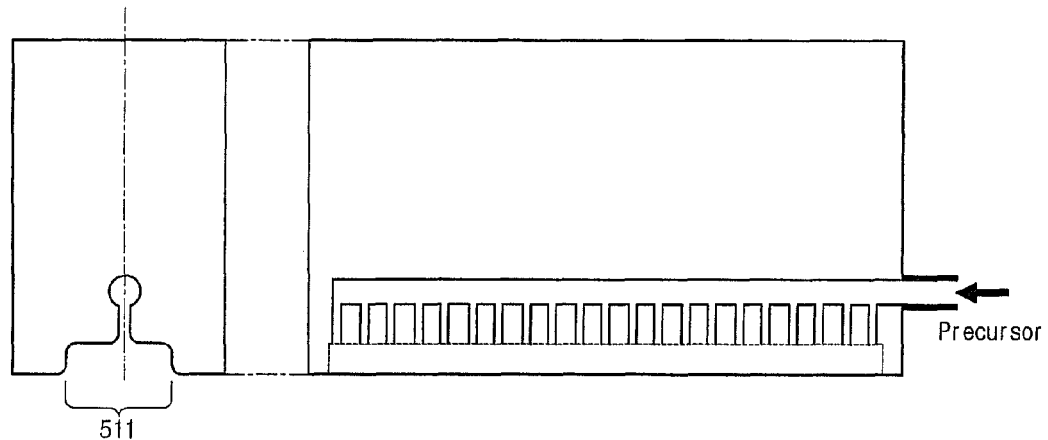
FIG. 7 is a lateral cross-sectional view of an injection unit 511 of a first module 51 shown in FIG. 5.
Figure 8A:
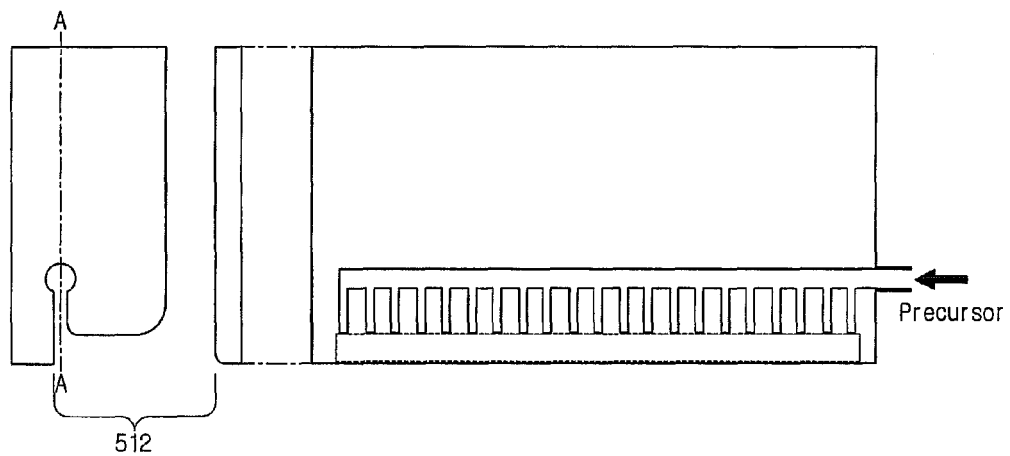
FIGS. 8A through 8D respectively illustrate lateral cross-sectional views, a plan view, and a bottom view of an exhaust unit 512 of the first module 51 shown in FIG. 5.
Figure 8B:
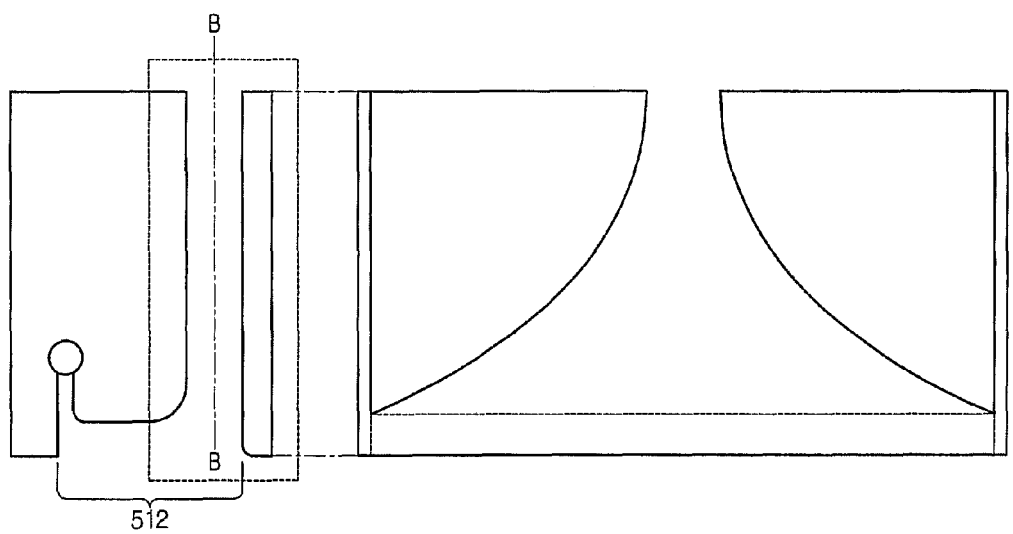
Figure 8C:
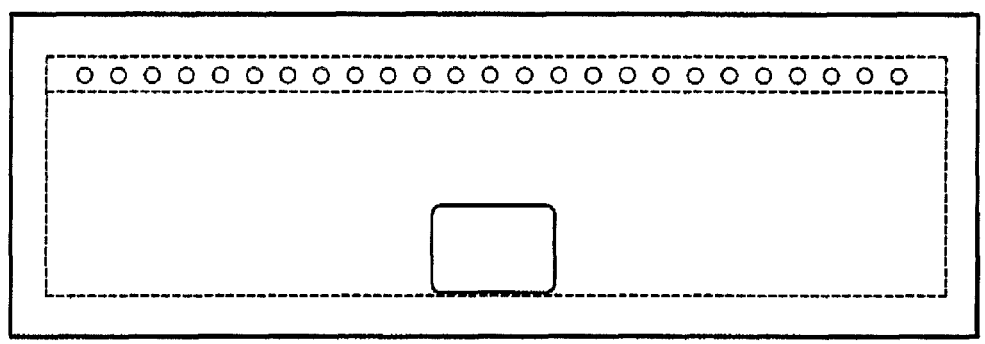
Figure 8D:
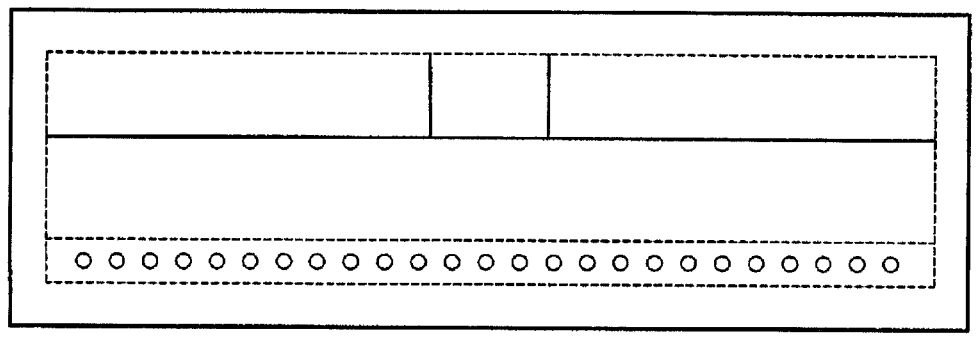

FIG. 6 illustrates a schematic overall view of the ALD reactor shown in FIG. 5. FIG. 7 is a lateral cross-sectional view of an injection unit 511 of the first module 51 shown in FIG. 5. FIG. 8A is a lateral cross-sectional view of the exhaust unit 512 of the first module 51 shown in FIG. 5, taken along line A-A, and FIG. 8B is a lateral cross-sectional view of the exhaust unit 512 of the first module 51, taken along line B-B. For an efficient pumping, the lateral faces are curved. FIG. 8C is a plan view of the exhaust unit 512 of the first module 51 shown in FIG. 5, and FIG. 8D is a bottom view of the exhaust unit 512 of the first module 51 shown in FIG. 5. Referring to FIG. 5, the injection unit 521 and the exhaust unit 522 of the second module 52 are identical in shape with the injection unit 511 and the exhaust unit 512 of the first module 51. In order to uniformly inject a precursor, a purge gas, and a reactant, a channel in a linear pipe shape having multiple perforated holes is used as an injector. At this time, injectors may be designed to have holes of varying sizes. Moreover, a precursor, a purge gas, and a reactant may be injected with a pipe-shaped channel through a lateral face as depicted in the drawings attached to this specification, or may be injected with a pipe-shaped channel from the top.

Figure 9:
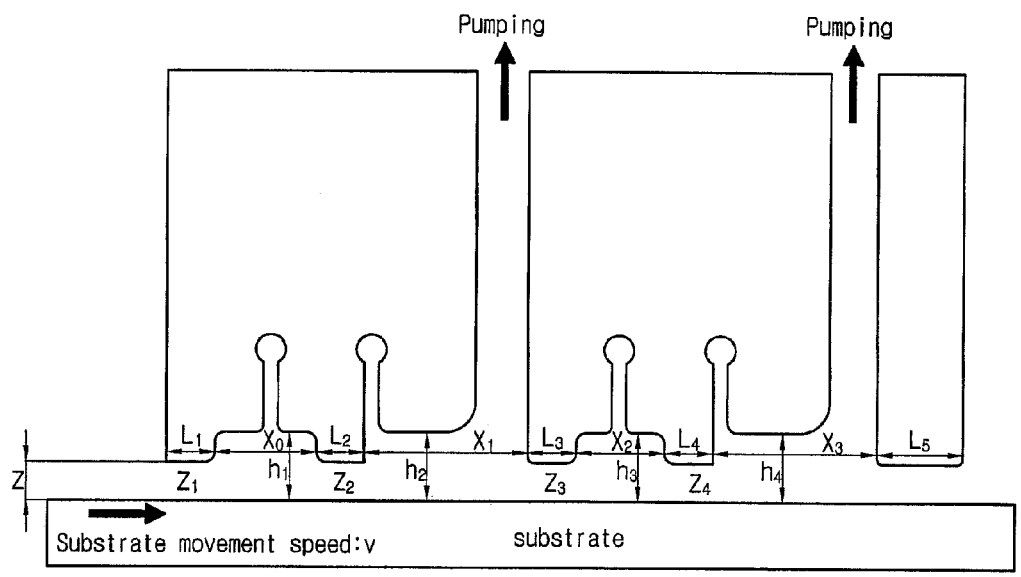
FIG. 9 indicates parameters of the ALD reactor shown in FIG. 5.

The structural components of the ALD reactor shown in FIG. 5 may be adjusted in size/spacing, and movement speed of a substrate can also be adjusted. FIG. 9 indicates parameters of the ALD reactor shown in FIG. 5. From FIG. 9, the time needed for each of four steps in one cycle of ALD is calculated as follows. 1st step: Precursor injection time=$x_0/v$, $2^{nd}$ step: Purge/Pumping time=$x_1/v$, $3^{rd}$ step: Reactant injection time=$x_2/v$, $4^{th}$ step: Purge/Pumping time=$x_3/v$.

As evident from FIG. 9, sizes/spacings of the structural components of the ALD reactor and movement speed of a substrate can be changed by adjusting parameters.

Referring to FIG. 9, in the first step of ALD a precursor fills a space at a portion of the injection unit 511 with a width $x_0$ in the first module 51 when a substrate passes under the reactor. In case the spacing $z_1$ between the reactor and the substrate at the injection unit 511 of the first module 51 is small, the target space is filled with precursors with a little leakage. That is, a sufficient amount of precursors can be supplied to the substrate if the width $x_0$ is made large, but the chances of adsorbing precursors on the substrate get lower if the width $x_0$ is made small. For designing a reactor, therefore, $x_0$ is set variably corresponding to the characteristics of a precursor to be used.

When the substrate passes by the exhaust unit 512 of the first module 51, precursors having been adsorbed on the surface of the substrate leave a chemically adsorbed molecular layer by injection and pumping of a purge gas (nitrogen or argon). Meanwhile, if the movement speed v of the substrate is made faster or the width xi of the reactor is made smaller for the intention of leaving some of precursors, not only a chemically adsorbed molecular layer but also part of a physical adsorption layer remain on the surface of the substrate for use in deposition.

In this manner, a chemically adsorbed molecular layer is left on the surface of the substrate as the substrate passes by the injection unit 511 and the exhaust unit 512 of the first module 51. Likewise, a reactant is injected when the substrate passes by the injection unit 521 of the second module 52 for the reactor, and is purged/pumped when the substrate passes by the exhaust unit 522 of the second module 52. After all, one or more atomic layers are formed on the substrate through the 4-step cycle of ALD, without any help from a valve or a similar product.

The following explains the 4-step cycle of ALD for forming a mono-atomic layer in use of the reactor shown in FIG. 9.

<$1^{st}$ Step>

When the substrate, being in a non-contact state separated from the reactor by a designated spacing z and moving at the speed of v, passes by the injection unit 511 (width, $x_0$) of the first module 51, a precursor is injected and a chemical adsorption layer and a physical adsorption layer are formed on the surface of the substrate.

<$2^{nd}$ Step>

When the substrate passes by the exhaust unit 512 (width, $x_1$) of the first module 51, a physical adsorption layer whose molecules are held together by a weak force or the Van der Waals attraction is separated from the substrate by a purge gas and is removed by pumping later. This leaves only a chemical adsorption layer on the surface of the substrate.

<$3^{rd}$ Step>

When the substrate passes by the injection unit 521 (width, $x_2$) of the second module 52, a reactant is injected to substitute a part of the chemical adsorption layer existing on the surface of the substrate. As a result, a desired atomic layer is formed on the surface of the substrate, and any surplus reactant remains in a physically adsorbed state.

<$4^{th}$ Step>

When the substrate passes by the exhaust unit 522 (width, $x_3$) of the second module 52, the physically adsorbed reactant having a weak intermolecular force is removed by a purge/pumping and a mono-atomic layer is formed on the surface of the substrate at the end.

With the reactor according to an embodiment of the invention, it is possible to form an atomic layer of a desired thickness (i.e., a desired number of layers) by adjusting the number of times the substrate passes under the reactor.

In FIG. 9, an inlet for injecting a precursor, a purge gas, or a reactant shows the typical shape of a fine hole with a diameter of 1-2 mm, but this size is also adjustable corresponding to the size of a substrate. Meanwhile, there are five guards (the 1$^{st}$ through 5$^{th}$ guards) having a size of $L_1$, $L_2$, $L_3$, $L_4$, and $L_5$, respectively, in order to distinguish each area of the reactor.

Considering that the 1$^{st}$ through 5$^{th}$ guards help injection materials at respective steps not to get mixed together, it seems to be better to make their widths $L_1$-$L_5$ large. However, in case of a reactor particularly designed for a semiconductor device manufactured on a 300 mm wafer, the guards being 10 mm wide or less are preferably used. Meanwhile, there is no restriction to a guard width $L_1$-$L_5$ as far as a large substrate is concerned. In other words, guards serve to isolate the respective step and to maximize the deposition efficiency of precursors while preventing a precursor leak. Here, the guard width $L_1$-$L_5$ is variable depending on the width $x_0$, $x_1$, $x_2$, and $x_3$ of the injection unit in each of the 4 steps for ALD. Moreover, the spacing $z_1$ between the first guard (width, $L_1$) of the first module 51 where the first step of ALD is performed may be set differently from the spacing $Z_3$ between the third guard (width, $L_3$) of the second module 52 where the third step of ALD is performed.

Therefore, it is an advantage of the reactor according to an embodiment of the invention that the configuration of the reactor may be designed in different ways by modifying its basic modules to meet diverse needs, for example, when more than two kinds of precursors need to be injected or when a reaction of more than two steps is carried out to form an atomic layer, etc.

Figure 10A:
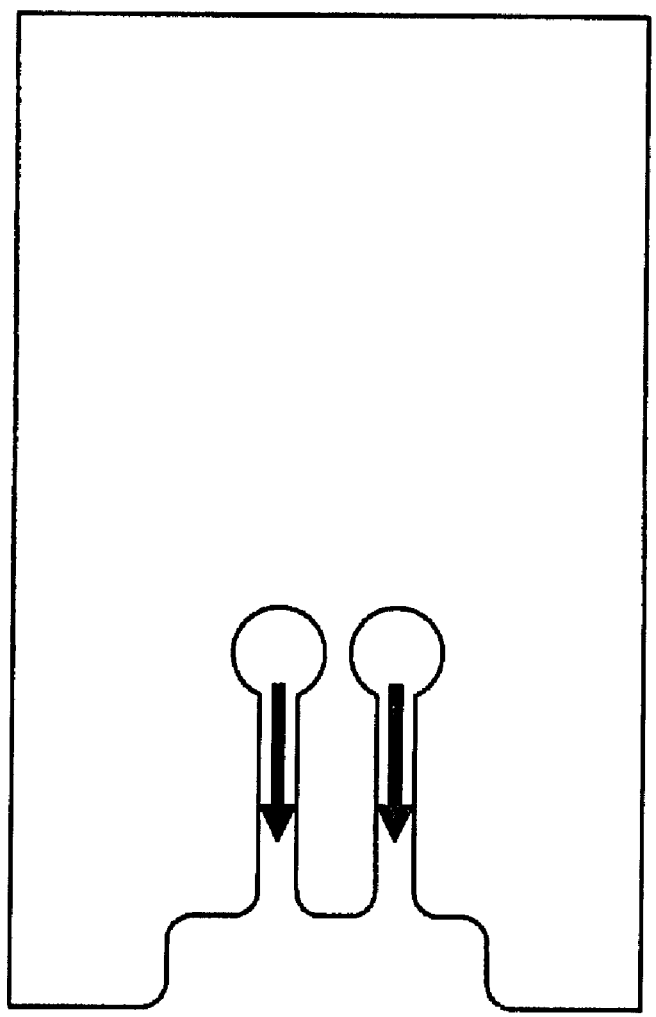
Figure 11A:
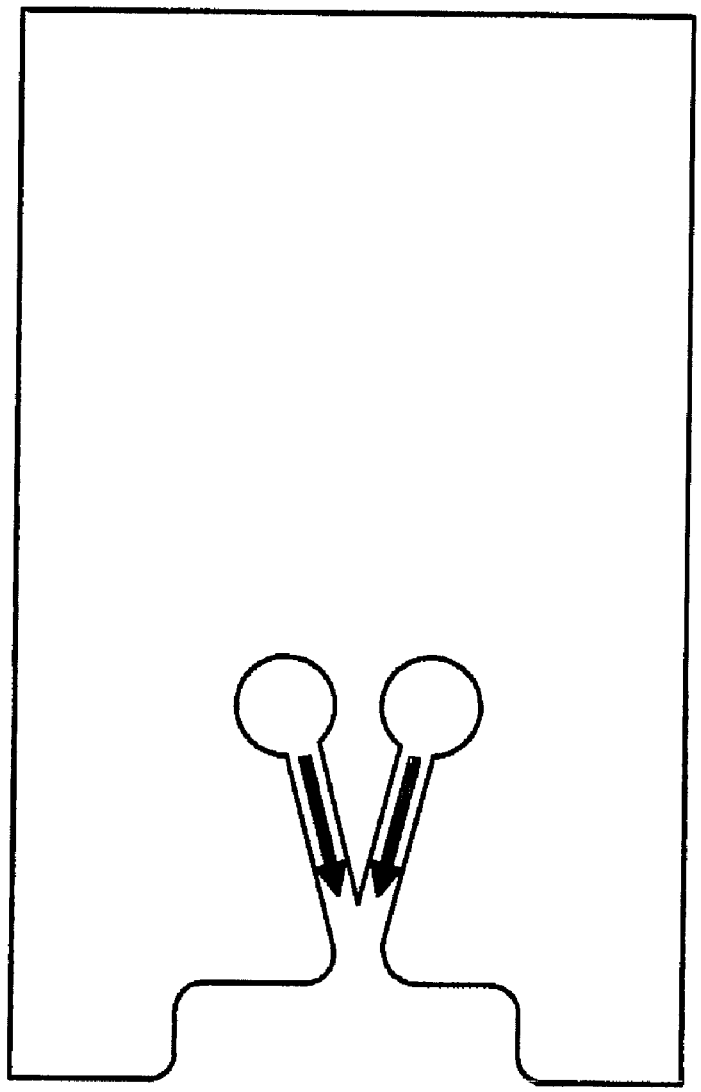
Figure 11B:
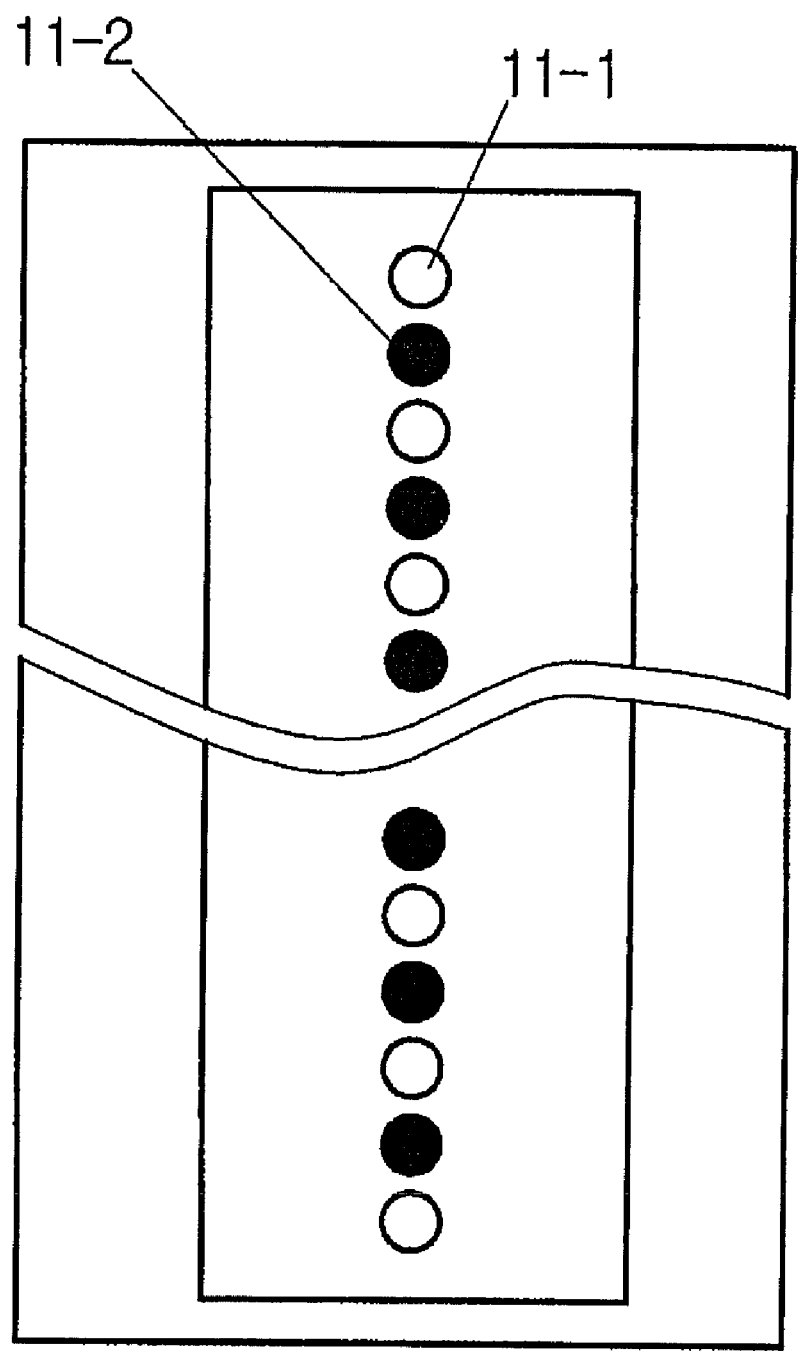

FIGS. 10 and 11 illustrate an injection unit with two inlets for a reactor module, wherein the inlets are respectively used for receiving two different kinds of precursors or reactants that do not interact with each other. In case of FIG. 10, two inlets are arranged side by side (see FIG. 10B), in which 10-1 is an inlet for a first precursor and 10-2 is an inlet for a second precursor. In case of FIG. 11, two inlets are arranged alternately one after another in a line (see FIG. 11B), in which 11-1 is an inlet for a first precursor and 11-2 is an inlet for a second precursor. With the configuration shown in FIG. 10 or FIG. 11, more than two different kinds of precursors or reactants can be fed or injected at the same time.

Figure 12:
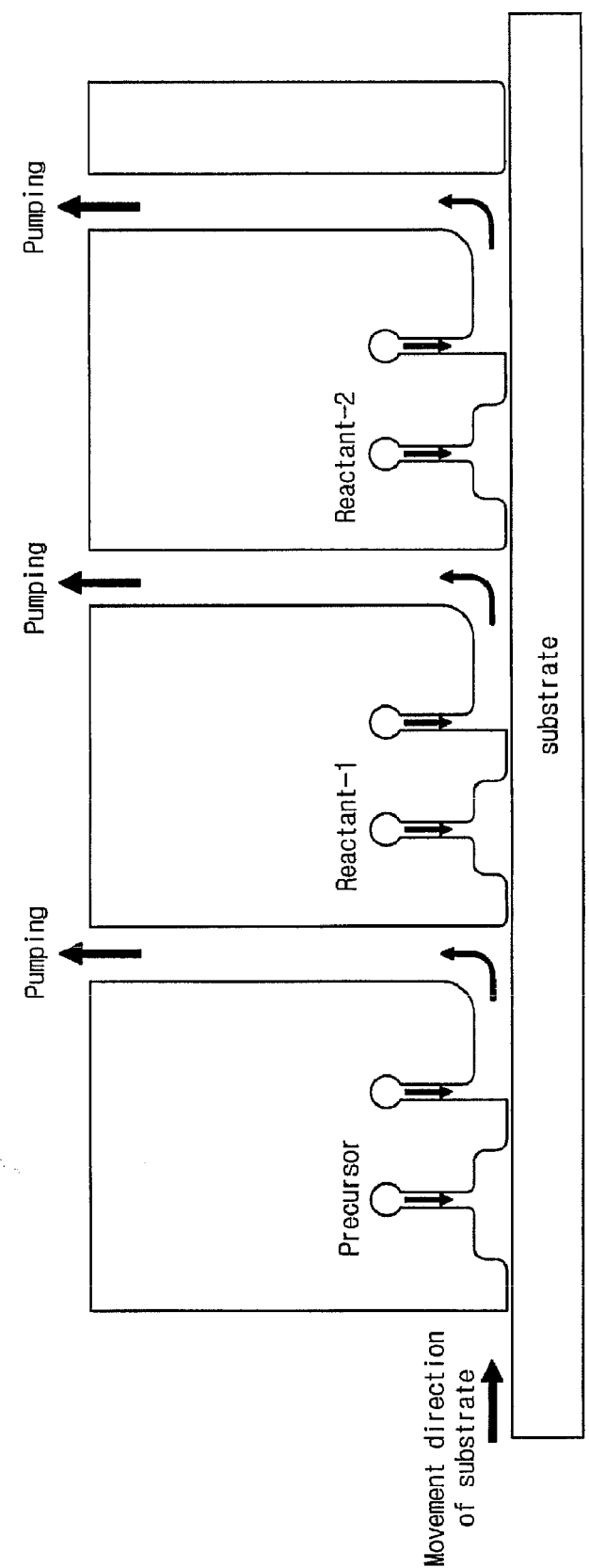
FIG. 12 illustrates a reactor performing a 2-step reaction to form an atomic layer.

FIG. 12 illustrates a reactor performing a 2-step reaction to form an atomic layer. To this end, the reactor has three basic modules, where two of them are used for receiving and exhausting a reactant. For instance, an organic metal precursor is first injected to adsorb organic metal molecules on the surface of a substrate, and hydrogen atoms are then injected to substitute the organic metal molecules to a metal hydride. After that, nitrogen atoms are injected to induce a secondary reaction for producing a metal nitride.

Figure 13:
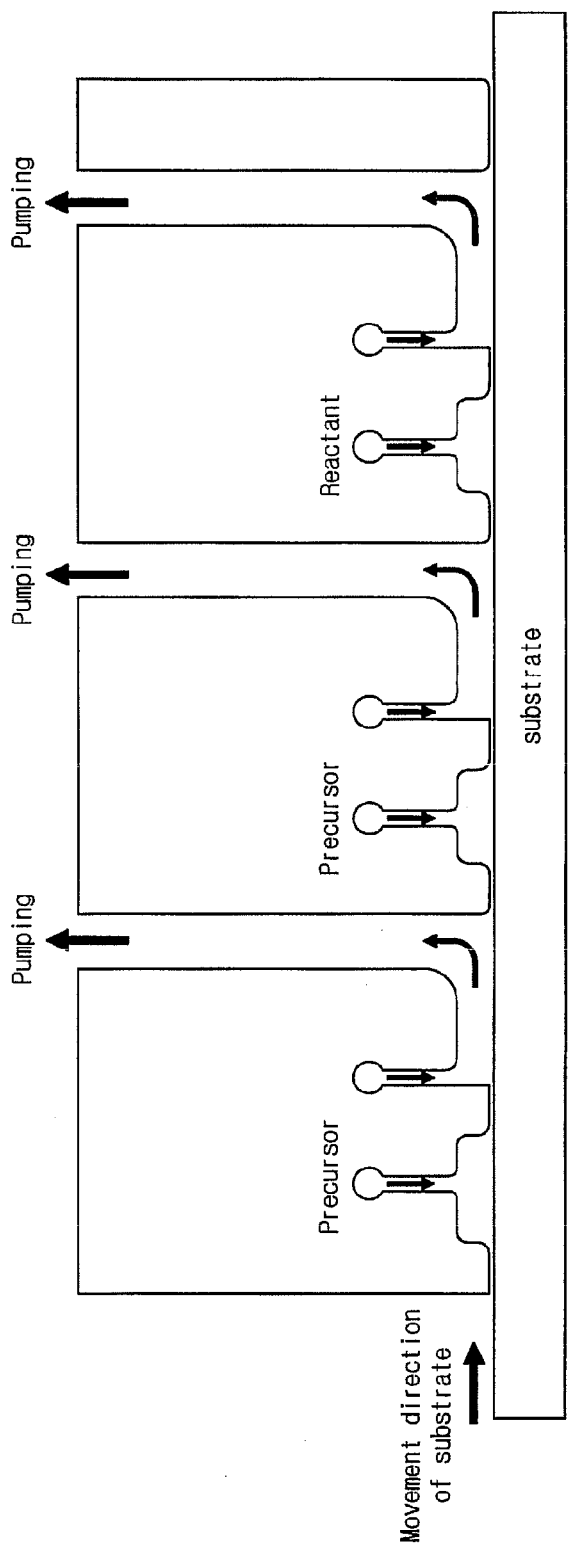
FIG. 13 illustrates two modules used for injecting and exhausting a precursor.

FIG. 13 illustrates a reactor having two modules for receiving and exhausting precursors. Suppose that a precursor not having the self-limiting nature (e.g., TiCl$_4$ or SiH$_4$) is injected. In case of a conventional reactor, the 4-step cycle of ALD had to be repeated several times to form a mono-atomic layer only. According to the present invention, however, a reactor is designed to have several precursor injection and exhaust modules and one reactant injection unit and exhaust unit at the end. Therefore, it only requires a substrate to pass by the reactor once for forming a mono-atomic layer.

Figure 14:
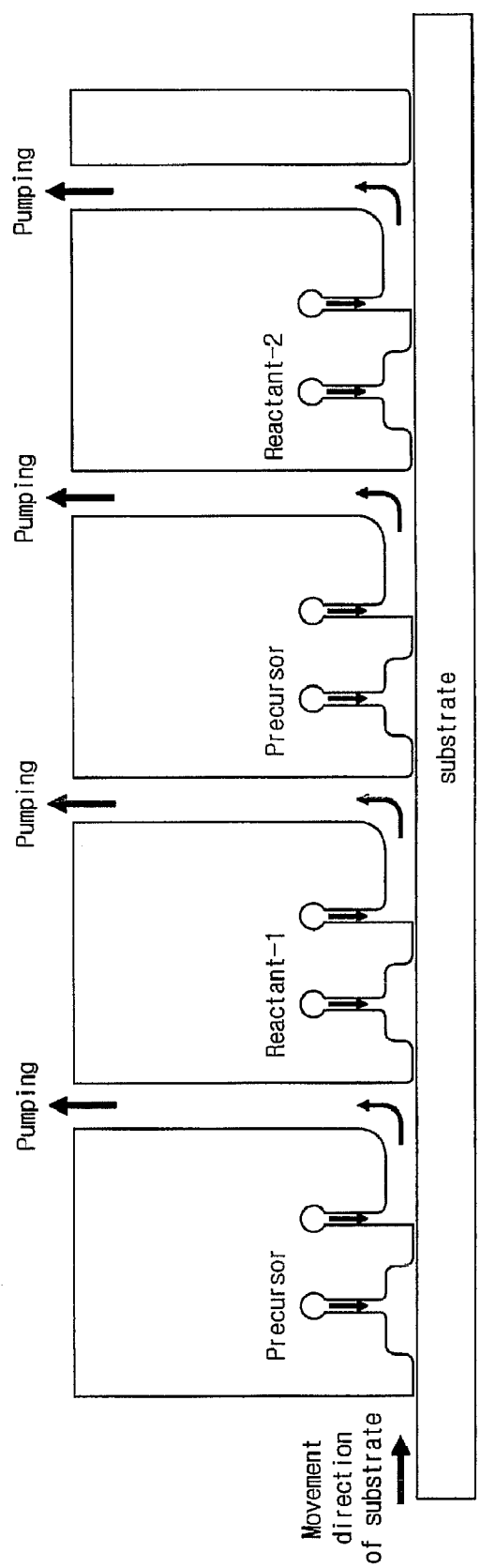
FIG. 14 illustrates a reactor, in which two-atomic layers are deposited every time a substrate passes by the reactor.

FIG. 14 illustrates a reactor, in which two-atomic layers are deposited every time a substrate passes by the reactor. At this time, when the same precursors are used, a homogeneous film is formed. For example, if a TiO$_2$ atomic layer is to be formed by using a precursor containing metal Ti atoms, a homogeneous thin film like TiO$_2$+TiO$_2$ or TiN+TiN can be formed. Meanwhile, when the same precursors yet different kinds of reactants are used, a heterogenous thin film made out of a material containing the same metal atoms can be formed. For example, by using a precursor containing metal Ti atoms, a heterogeneous thin film like TiN+TiO$_2$ or TiO$_2$+TiN can be formed. In addition, the use of different precursors may be followed by the formation of atomic layers of two different kinds. For example, a heterogeneous oxide film like TiO$_2$+SiO$_2$ or a heterogenous thin film like AlN+SiO$_2$ can be formed.

The reactor according to an embodiment of the present invention may be configured to include a cooling and heating means, a UV irradiation means, a plasma application means, and a super high frequency application means.

Figure 15:
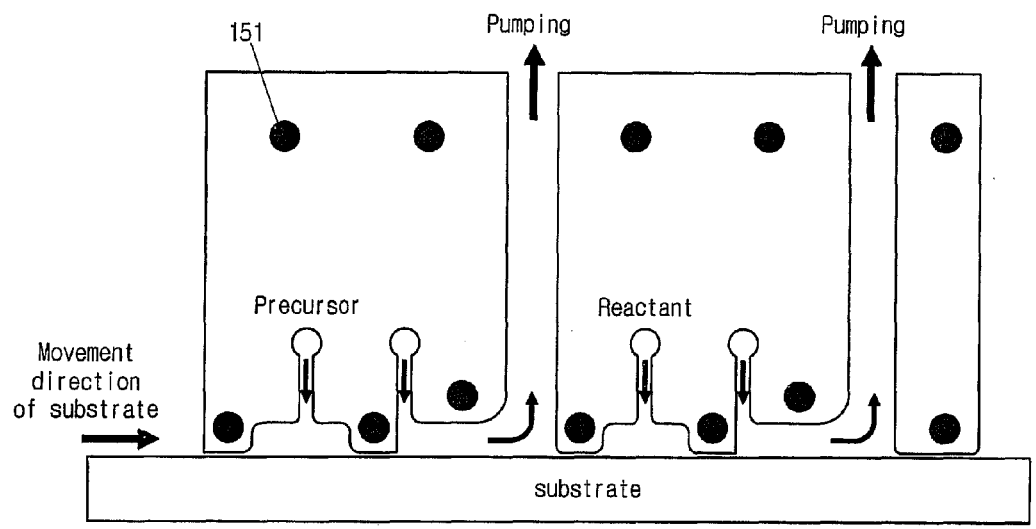
FIG. 15 illustrates a reactor comprising a cooling/heating means.

FIG. 15 illustrates a reactor provided with a cooling means or a heating means. Reference numeral 151 denotes a cooling/heating means. A cooling process is required for keeping an increased vapor pressure of a precursor caused by precursor decomposition at the time of supply at the same temperature as a reactor (or reactor body), or for cooling down a reactor having been heated by a plasma or UV catalytic reaction. On the contrary, a heating process is required to keep the reactor (or reactor body) at a high temperature especially when a precursor was condensed at a low temperature or vapor pressure of the precursor was lowered. In other words, a proper heating temperature needs to be set in order to prevent any changes in the process results after a precursor was condensed instead of being decomposed or after vapor pressure of the precursor was lowered. Although the heating temperature is variable according to precursor materials being used, it can be within a range from 70 to 150° C. Heat rays are utilized as the heating means, and measurement control is done by a thermocouple.

Figure 16:
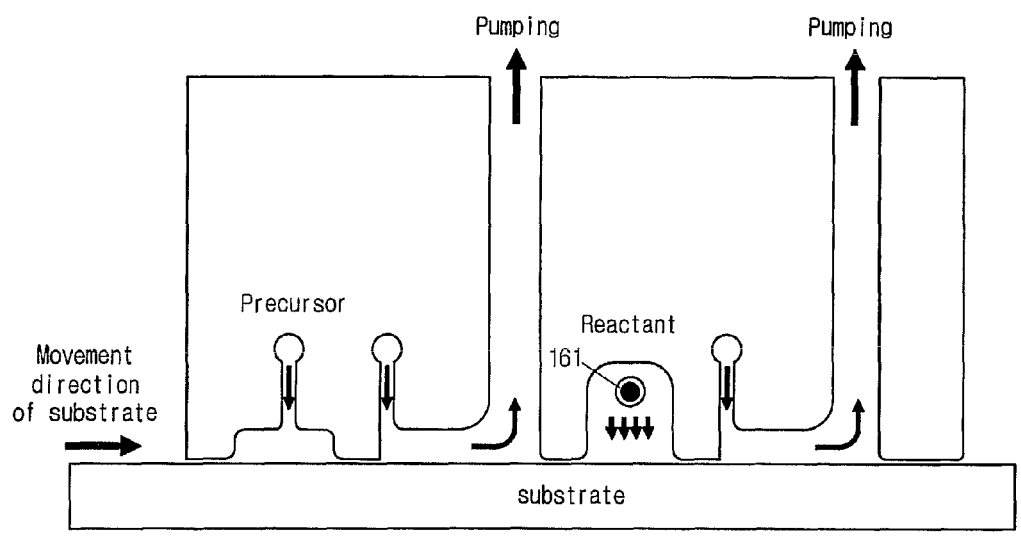
FIGS. 16 through 18 respectively illustrate a reactor comprising a means for direct UV irradiation.
Figure 17:
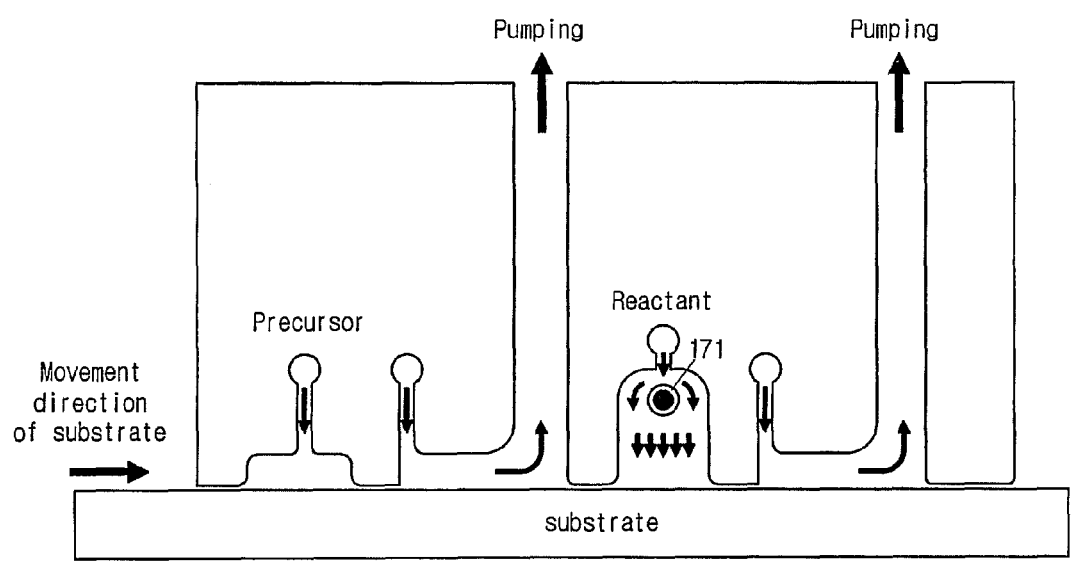
Figure 18:
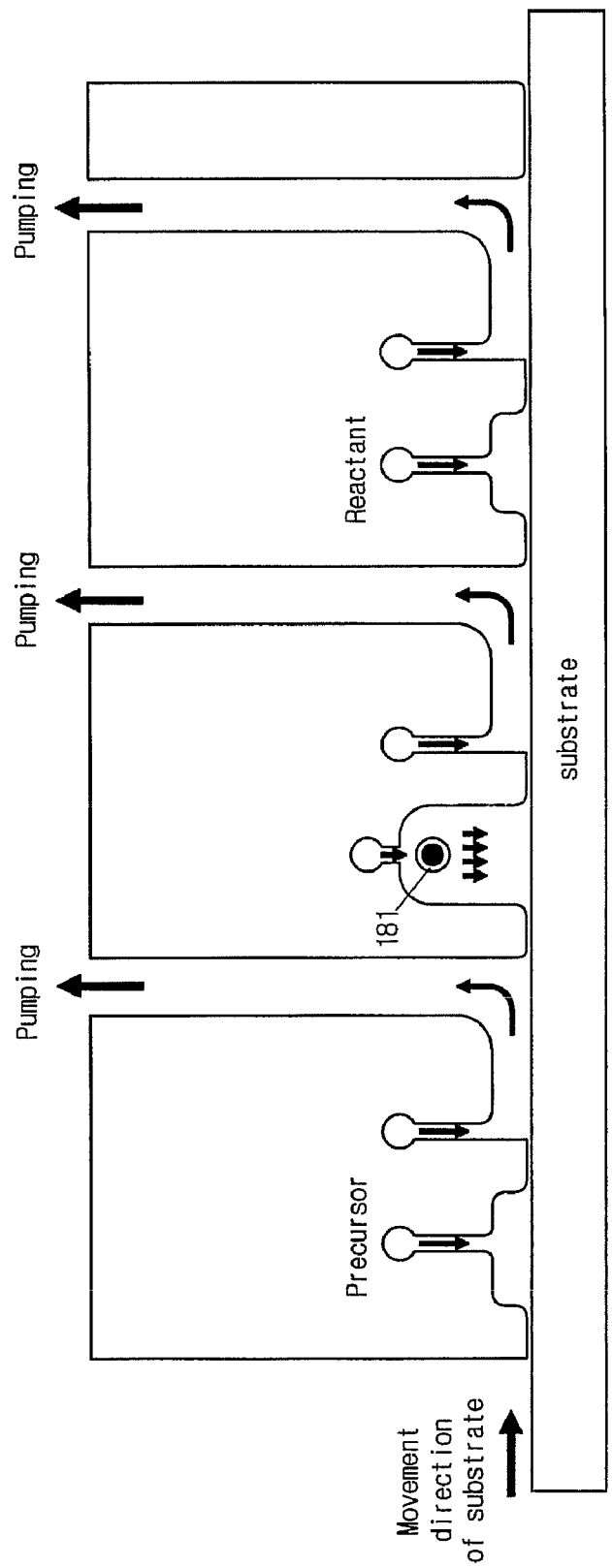

FIGS. 16 through 18 respectively illustrate a reactor provided with a means for direct UV irradiation. Reference numerals 161, 171, and 181 in the drawings denote a UV irradiation means. When a reaction between a reactant and a layer of precursor molecules adsorbed at the surface of a substrate is either weak or incomplete, or when a particular bond in the adsorbed layer of precursor molecules has to be broken, UV rays of a specific wavelength or below are irradiated onto the substrate for inducing a complete reaction. FIG. 16 depicts that UV rays are irradiated onto the adsorbed molecular layer to destroy an intermolecular bonding and a bonding between a metal atom and a molecule. FIG. 17 depicts that UV rays activate a reactant to induce a more activated reaction or a complete reaction. FIG. 18 depicts that some of the molecular bonds adsorbed at the surface of a substrate are taken off by UV rays and react with an injected reactant to induce a complete reaction or a multi-step reaction.

Figure 19:
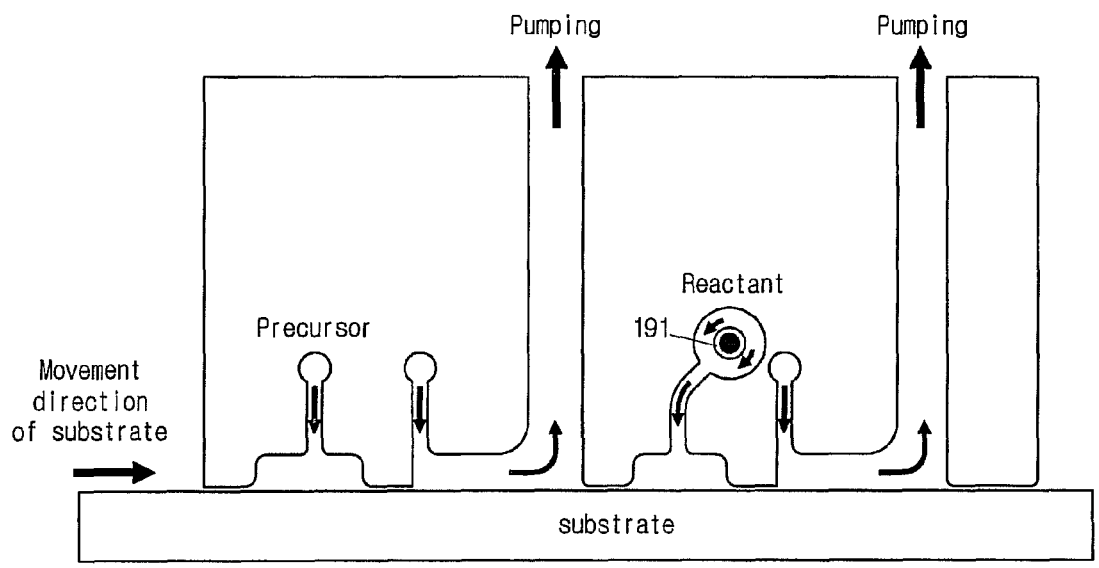
FIGS. 19 through 21 respectively illustrate a reactor comprising a means for indirect UV irradiation.
Figure 20:
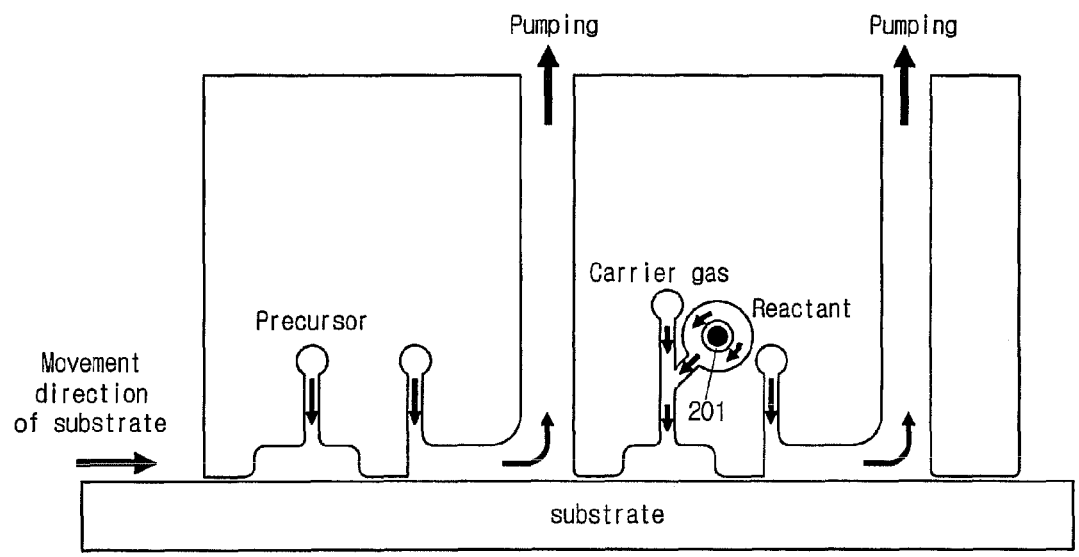
Figure 21:
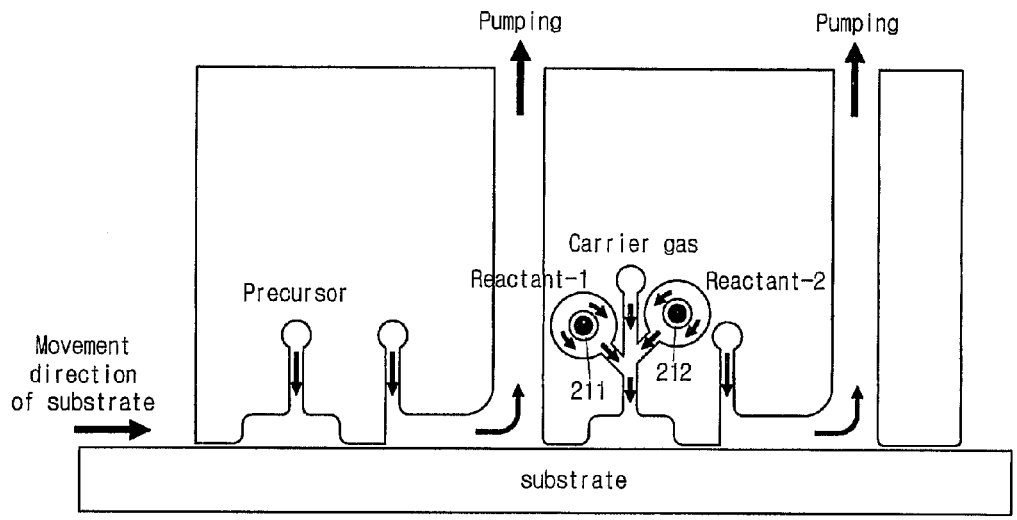

FIGS. 19 through 21 respectively illustrate a reactor provided with a means for indirect UV irradiation. Reference numerals 191, 201, 211, and 212 in the drawings denote a UV irradiation means. It is useful when UV rays should not be irradiated directly onto a substrate if the substrate is easily deformed or denatured by UV rays. FIG. 19 shows a case where the activity of a reactant is too large, so the reactant is activated by UV rays in a separate space and the remotely generated activated atoms or radicals are injected into a substrate to induce a complete reaction. FIGS. 20 and 21 respectively illustrate a reactor having a down-stream UV reaction chamber and a purge/pumping chamber. In the reactor shown in FIG. 20, a reactant is activated to a radical state and is fed towards a substrate by means of a carrier gas, so more than one kind of reactant can be activated. In the reactor shown in FIG. 21, two kinds of reactants are utilized to form a thin film. Although it is believed that a mixture of two different kinds of reactants often causes an unstable thin film formation or makes it difficult to obtain a desired thin film in case that the reactants are different in activity or activation energy, the reactor of FIG. 21 resolves such problems by respectively activating those two kinds of reactants to a desired level by UV lamps of different wavelengths to form a thin film. Meanwhile, in some cases different kinds of reactants are mixed and form a new compound, or activity may be decreased. Even in that case, the reactors of FIGS. 20 and 21 can be advantageously used for separating the mixed reactants. At this time, an injection unit having the structure shown in FIG. 10 or FIG. 11 may be employed to prevent reactants from mixing together.

Figure 22:
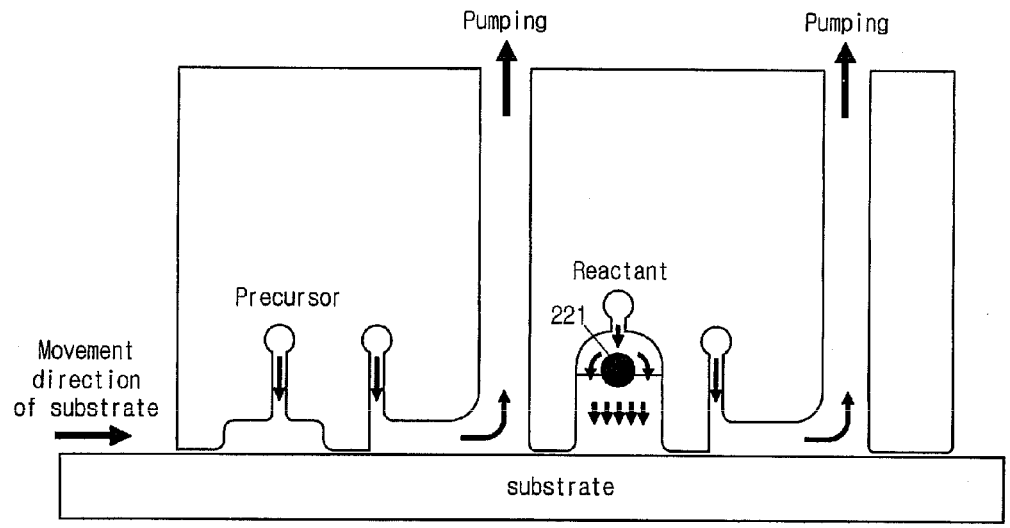
FIGS. 22 through 25 respectively illustrate a reactor comprising a means for plasma applications.
Figure 23:
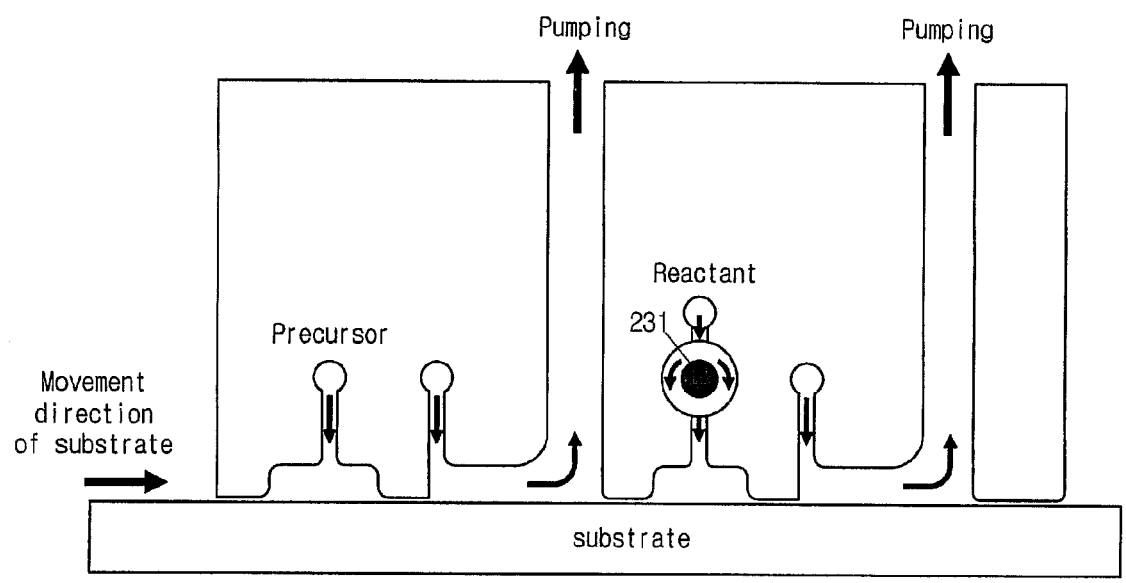
Figure 24:
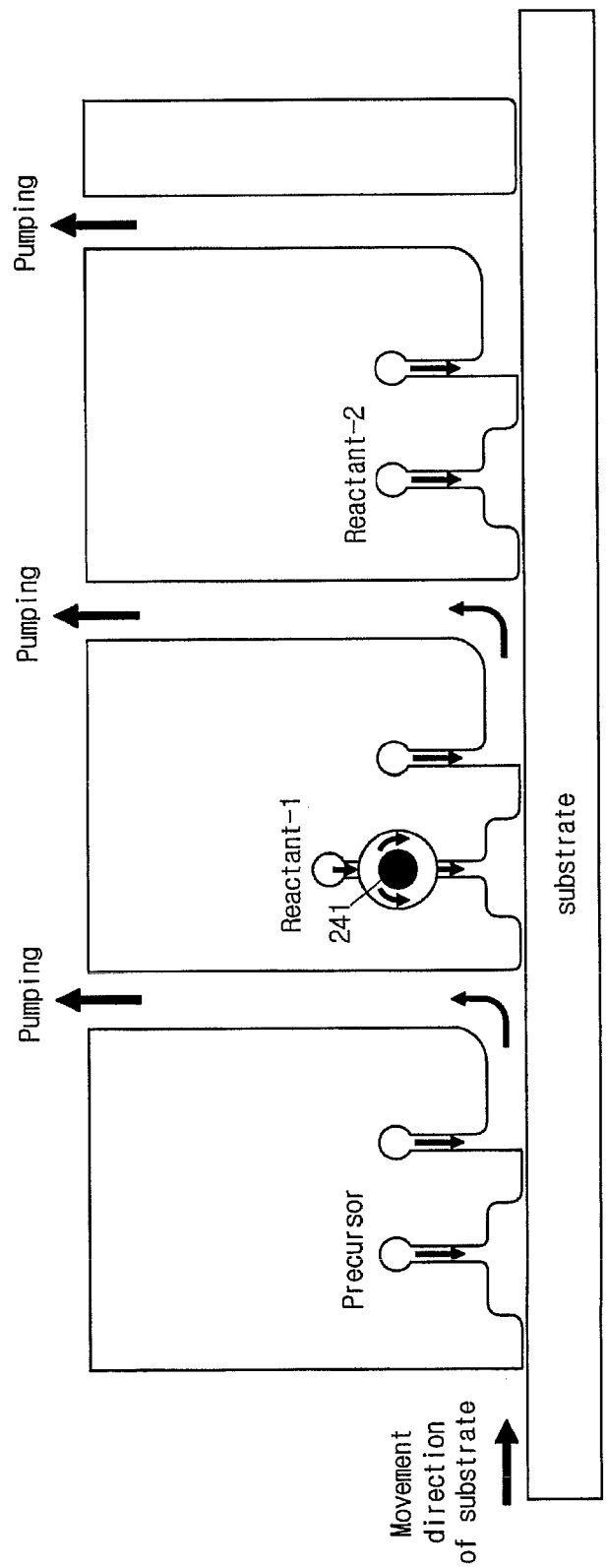
Figure 25:
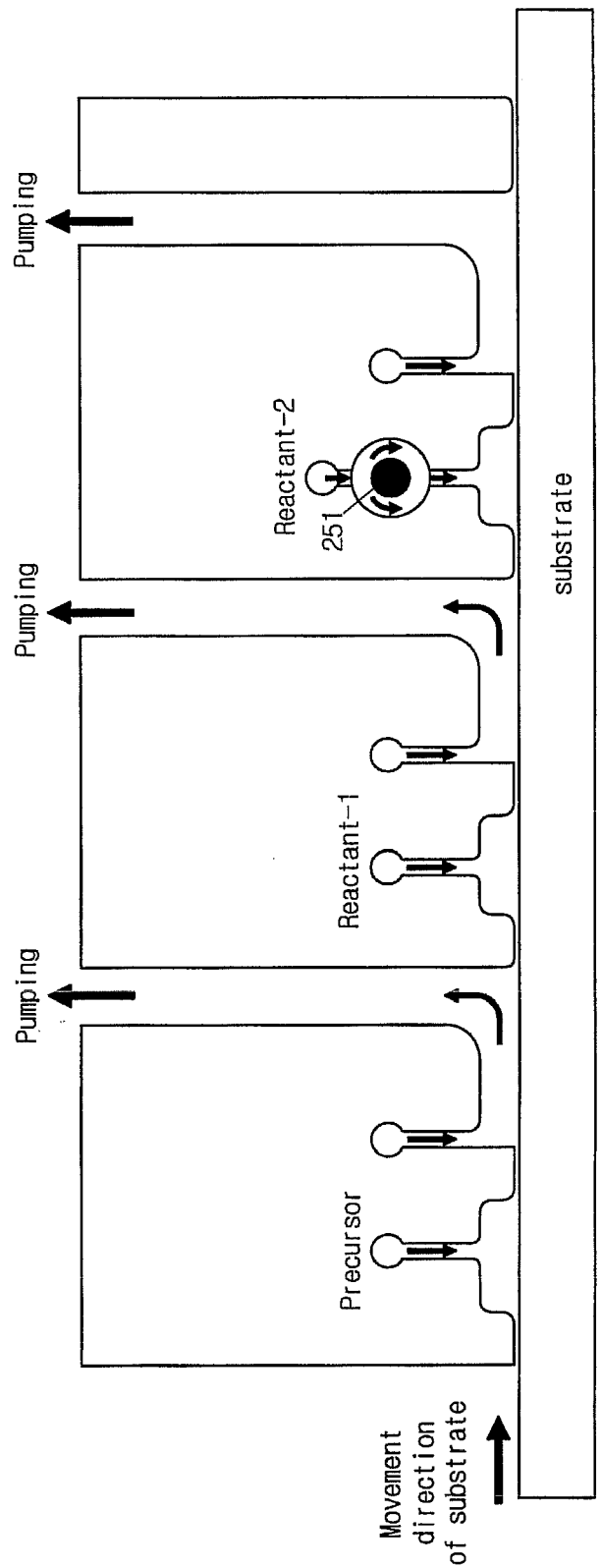

FIGS. 22 through 25 respectively illustrate a reactor provided with a plasma application means. Reference numerals 221, 231, 241, and 251 in the drawings denote a plasma application means. In detail, FIG. 22 shows a reactor having a concentric type plasma generation device for generating homogeneous plasma, and downstream radicals. FIG. 23 shows a reactor having a plasma generating space where plasma is generated exclusively and become downstream plasma radicals. FIGS. 24 and 25 respectively show a reactor having a plasma application means for multi-step reactions.

Figure 26:
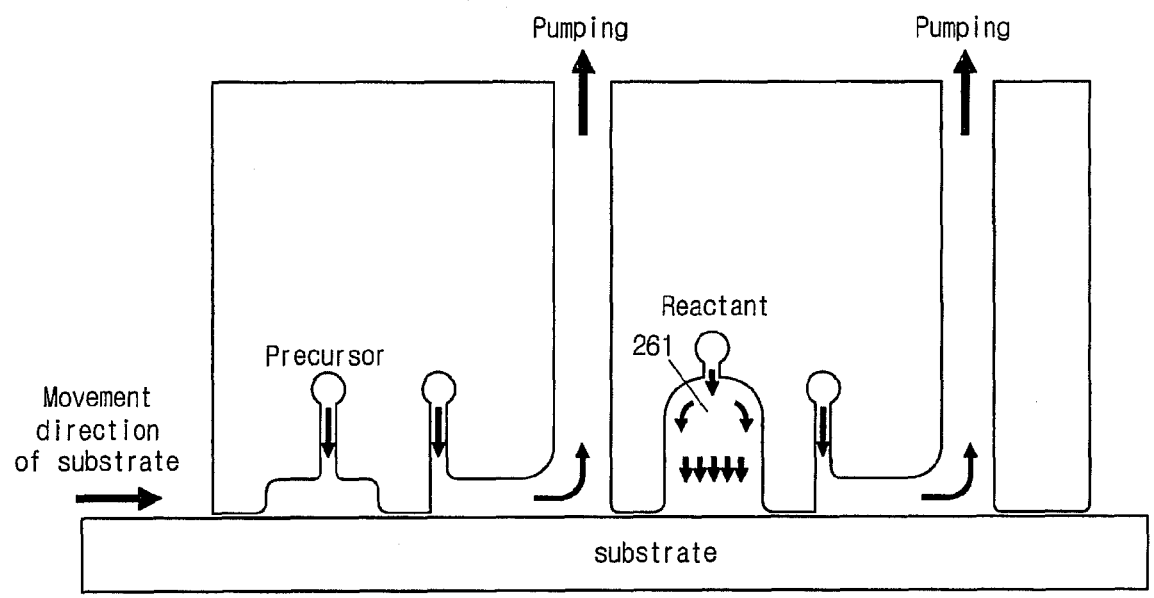
FIGS. 26 and 27 respectively illustrate a reactor comprising a means for microwave applications.
Figure 27:
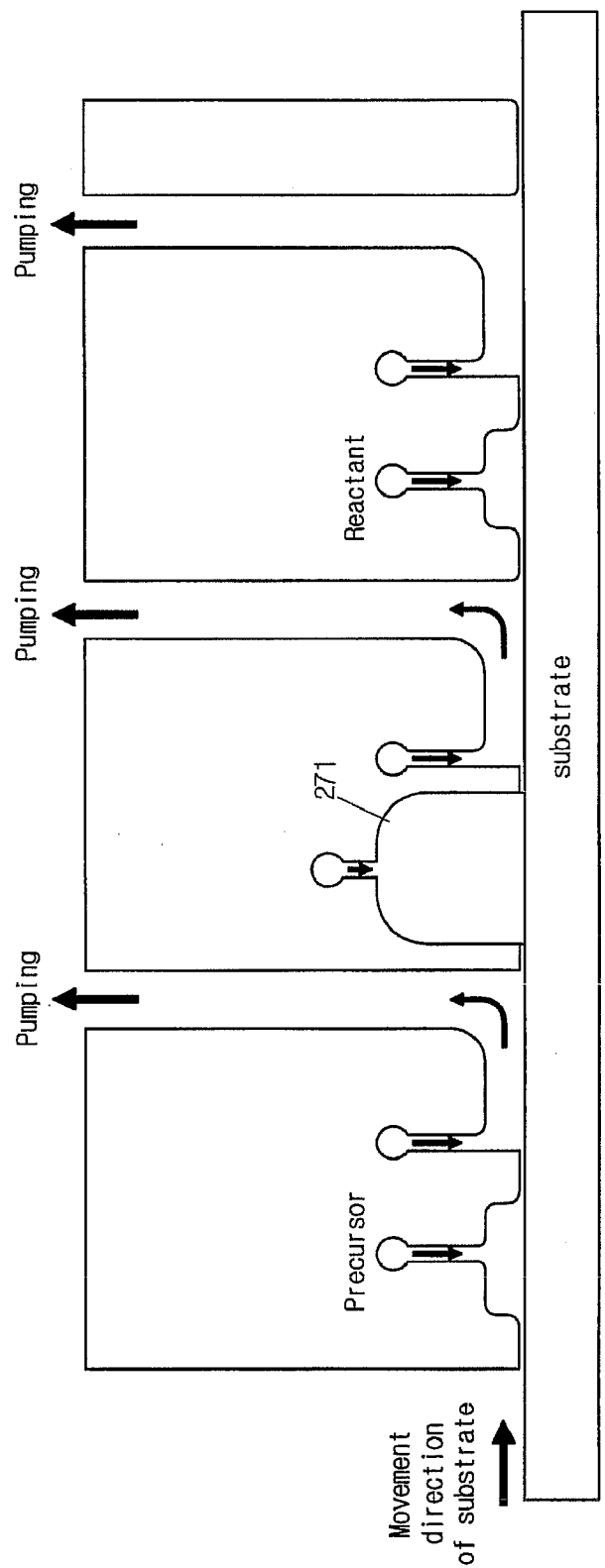

FIGS. 26 and 27 respectively illustrate a reactor provided with a super high frequency application means. Reference numerals 261 and 271 in the drawings denote a super high frequency application means. In order to embody an atomic layer deposition method using a super high frequency of $10^9$ Hz or higher, the reactor is made out of a metallic material such as stainless steel or aluminum. When the spacing (typically 2-3 mm) between a substrate and a reactor is sufficiently small, the inner space of the reactor body may serve as a super high frequency cavity, capable of preventing a super high frequency leakage by keeping the super high frequency inside the reactor space only. Therefore, impedance matching for super high frequencies becomes relatively easy, and the application of a super high frequency following the injection of a reactant or hydrogen gas creates an activated state or radical state suitable for forming a thin film with superior deposition characteristics at a low temperature. Because an inlet for injecting a reactant or hydrogen is about 1 mm in size, which is too small for a super high frequency to transmit, even a low super-high frequency power is able to induce a sufficient reaction.

As has been explained so far, by using a small-size inlet, the vapor deposition reactor according to an embodiment of the invention can provide homogeneous film properties, improve the deposition efficiency of precursors, and reduce an amount of time required for a purge/pumping process. In addition, since the reactor itself is configured to reflect each step of ALD, it does not need a valve. Moreover, the reactor is designed to make it easier for users to apply remote plasma, use super high frequencies, and irradiate ultraviolet rays.

While the present invention has been described with respect to the specific embodiments, it will be apparent to those skilled in the art that various changes and modifications may be made without departing from the spirit and scope of the invention as defined in the following claims.

What is claimed is:

1. A vapor deposition reactor being configured to make a substrate pass by the reactor through a relative motion between the substrate and the reactor in a non-contact state, comprising:

a first injection unit having a first space for receiving a precursor or a reactant and exposing the substrate to the precursor or reactant, the precursor or reactant is supplied to the first space through a precursor or reactant supply channel opening into the first space;

a first exhaust unit having a second space for receiving a purge gas and exposing the substrate to the purge gas, the purge gas is supplied to the second space through a purge gas supply channel opening into the second space, the first exhaust unit exhausting the precursor or reactant and the purge gas by pumping the precursor or reactant and the purge gas through an exhaust channel opening into the second space;

a second injection unit having a third space for receiving a reactant and exposing the substrate to the reactant, the reactant is supplied to the third space through a reactant supply channel opening into the third space; and a second exhaust unit having a fourth space for receiving the purge gas and exposing the substrate to the purge gas through a purge gas supply channel opening into the fourth space, the second exhaust unit exhausting the reactant and the purge gas by pumping the reactant and the purge gas through an exhaust channel opening into the fourth space;

wherein the first injection unit, the first exhaust unit, the second injection unit and the second exhaust unit are arranged along a direction of the relative motion between the substrate and the reactor and include guard barriers to control the flow of the precursor, reactant, or purge gas between the first, second, third and fourth spaces; and wherein deposition conditions are varied according to a pressure in the first injection unit and the second injection unit.

2. The vapor deposition reactor of claim 1, wherein the relative motion of the substrate and the reactor is a linear motion.

3. The vapor deposition of claim 1, wherein the relative motion of the substrate and the reactor is a rotational motion.

4. The vapor deposition reactor of claim 1, wherein the precursor or reactant gas supply channels of the injection unit and the purge gas supply channel and exhaust channel of the exhaust unit are formed in the shape of a linear pipe having multiple perforated holes as inlets.

5. The vapor deposition reactor of claim 1, wherein a portion of the first exhaust unit and a portion of the second exhaust unit are curved.

6. The vapor deposition reactor of claim 1, wherein a relative speed of the substrate and the reactor becomes a vapor deposition parameter.

7. The vapor deposition reactor of claim 1, wherein a spacing between the substrate and the reactor becomes a vapor deposition parameter.

8. The vapor deposition reactor of claim 1, wherein a width of the injection unit or a width of the exhaust unit becomes a vapor deposition parameter.

9. The vapor deposition reactor of claim 1, wherein each of the first injection unit and the second injection unit comprises a plurality of inlets.

10. The vapor deposition reactor of claim 9, wherein the plurality of inlets are arranged in parallel or alternately in a line.

11. The vapor deposition reactor of claim 1, further comprising:

a third injection unit having a fifth space for receiving the reactant, the reactant is supplied to the fifth space through a reactant supply channel opening into the fifth space; and a third exhaust unit having a sixth space for receiving the purge gas, the purge gas is supplied to the sixth space through a purge gas supply channel opening into the sixth space, the third exhaust unit exhausting the reactant and the purge gas by pumping the reactant and the purge gas through an exhaust channel opening into the sixth space.

12. The vapor deposition reactor of claim 1, further comprising:
a third injection unit having a fifth space for receiving the precursor, the precursor is supplied to the fifth space through a precursor supply channel opening into the fifth space; and
a third exhaust unit having a sixth space for receiving the purge gas, the purge gas is supplied to the sixth space through a purge gas supply channel opening into the sixth space, the third exhaust unit exhausting the reactant and the purge gas by pumping the precursor and the purge gas through an exhaust channel opening into the sixth space.

13. The vapor deposition reactor of claim 1, comprising a plurality of reactor units, each reactor unit comprising the first injection unit, the first exhaust unit, the second injection unit and the second exhaust unit so that a plurality of atomic layers are deposited each time the substrate passes by the reactor for ALD.

14. The vapor deposition reactor according to anyone of claims 11 through 13, further comprising a cooling or heating means provided inside the first injection unit or the second injection unit.

15. The vapor deposition reactor according to any of claims 11 through 13, further comprising a UV irradiation means provided inside the injection unit.

16. The vapor deposition reactor according to any one of claims 11 through 13, further comprising a plasma application means provided inside the first injection unit or the second injection unit.

17. The vapor deposition reactor according to any one of claims 11 through 13, further comprising a microwave application means provided inside the first injection unit or the second injection unit.

18. The vapor deposition reactor according to claim 1, wherein the first space is in gas communication with the second space and wherein the third space is in communication with the fourth space.

19. The vapor deposition reactor according to claim 11, wherein the fifth space is in gas communication with the sixth space.

20. The vapor deposition reactor according to claim 12, wherein the fifth space is in communication with the sixth space.

* * * * *

UNITED STATES PATENT AND TRADEMARK OFFICE
CERTIFICATE OF CORRECTION

PATENT NO. : 8,333,839 B2
APPLICATION NO. : 11/965235
DATED : December 18, 2012
INVENTOR(S) : Jae-eung Oh It is certified that error appears in the above-identified patent and that said Letters Patent is hereby corrected as shown below:

In the Claims

In claim 14, column 9, line 23, please replace --anyone-- with "any one".

Signed and Sealed this
Thirtieth Day of July, 2013

Teresa Stanek Rea
*Acting Director of the United States Patent and Trademark Office*